(12) United States Patent
Kim et al.

(10) Patent No.: US 12,394,648 B2
(45) Date of Patent: Aug. 19, 2025

(54) DISPLAY TRANSFER STRUCTURE INCLUDING LIGHT EMITTING ELEMENTS AND TRANSFERRING METHOD OF LIGHT EMITTING ELEMENTS

(71) Applicant: SAMSUNG ELECTRONICS CO., LTD., Suwon-si (KR)

(72) Inventors: Hyunjoon Kim, Seoul (KR); Seogwoo Hong, Yongin-si (KR); Kyungwook Hwang, Seoul (KR); Junsik Hwang, Hwaseongi-si (KR); Dongho Kim, Seoul (KR); Joonyong Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 642 days.

(21) Appl. No.: 17/506,154

(22) Filed: Oct. 20, 2021

(65) Prior Publication Data
US 2022/0285188 A1 Sep. 8, 2022

Related U.S. Application Data

(60) Provisional application No. 63/155,477, filed on Mar. 2, 2021.

(30) Foreign Application Priority Data

Jun. 10, 2021 (KR) .................. 10-2021-0075636

(51) Int. Cl.
*H01L 21/673* (2006.01)
*B65G 47/90* (2006.01)
(Continued)

(52) U.S. Cl.
CPC ........ *H01L 21/67333* (2013.01); *B65G 47/90* (2013.01); *H10H 20/819* (2025.01); *H10H 20/857* (2025.01)

(58) Field of Classification Search
CPC ........ B65G 47/74; B65G 47/90; B65G 61/00; B65G 47/907; H01L 2924/15155;
(Continued)

(56) References Cited

U.S. PATENT DOCUMENTS 4,528,747 A * 7/1985 Hoffman ............ H05K 13/0482
269/157
5,545,291 A * 8/1996 Smith .................... H01L 23/13
257/E21.705
(Continued)

FOREIGN PATENT DOCUMENTS

CN 109950182 A 6/2019
JP 2004-22846 A 1/2004
(Continued)

OTHER PUBLICATIONS

Communication issued Jun. 22, 2022 by the European Patent Office for European Patent Application No. 21211854.1.
(Continued)

*Primary Examiner* — Sophia T Nguyen
(74) *Attorney, Agent, or Firm* — Sughrue Mion, PLLC

(57) ABSTRACT

Provided is a display transfer structure including a substrate including a plurality of wells, and a plurality of light emitting elements disposed in the plurality of wells, wherein the plurality of light emitting elements have a rotationally asymmetric planar shape, and wherein the plurality of wells respectively have a planar shape different from a planar shape of each of the plurality of light emitting elements.

16 Claims, 24 Drawing Sheets

(51) Int. Cl.
*H10H 20/819* (2025.01)
*H10H 20/857* (2025.01)

(58) Field of Classification Search
CPC . H01L 2924/15157; H01L 2924/15153; H01L 2924/1515; H01L 25/075; H01L 25/0753; H01L 2224/95085; H01L 2224/93; H01L 2224/9512; H01L 2224/95101; H01L 2224/951; H01L 2224/95136; H01L 2224/95123; H01L 2224/95121; H10H 20/01; H10H 20/036; H10H 20/821; H10H 20/819; H10H 29/01; H10H 29/011; H10H 29/02; H10H 29/03; H10H 29/10; H10H 29/14; H10H 29/142; H10H 29/24; H10H 29/20

See application file for complete search history.

(56) References Cited

U.S. PATENT DOCUMENTS

| | | | | |
|---|---|---|---|---|
| 6,291,896 | B1* | 9/2001 | Smith | G09G 3/3648 257/E23.079 |
| 6,611,237 | B2* | 8/2003 | Smith | H01Q 21/0087 333/157 |
| 6,657,289 | B1* | 12/2003 | Craig | H01L 24/95 257/713 |
| 6,825,049 | B2* | 11/2004 | Fonstad, Jr. | H01L 24/97 438/694 |
| 6,844,673 | B1* | 1/2005 | Bernkopf | H10K 59/1275 313/511 |
| 7,232,704 | B2* | 6/2007 | Singh | H10F 39/804 257/E21.705 |
| 7,385,284 | B2* | 6/2008 | Carrender | G06K 19/0723 257/692 |
| 7,551,141 | B1* | 6/2009 | Hadley | H01L 24/95 343/873 |
| 7,588,350 | B2* | 9/2009 | Takenaka | H01L 25/0753 361/704 |
| 7,774,929 | B2* | 8/2010 | Jacobs | H01L 24/31 438/26 |
| 8,246,409 | B2* | 8/2012 | Green | H01J 17/49 445/24 |
| 8,284,120 | B2* | 10/2012 | Hillis | G09G 3/2085 345/55 |
| 8,356,913 | B2* | 1/2013 | Nagai | H01L 25/0753 362/240 |
| 8,516,683 | B2* | 8/2013 | Credelle | H01Q 7/00 29/601 |
| 8,860,635 | B2* | 10/2014 | Hillis | H01L 24/95 445/24 |
| 9,281,451 | B2* | 3/2016 | Yeh | H01L 25/0753 |
| 9,722,145 | B2* | 8/2017 | Sasaki | H01L 24/95 |
| 9,825,202 | B2 | 11/2017 | Schuele et al. | |
| 9,911,764 | B2* | 3/2018 | Bae | H01L 25/167 |
| 9,917,226 | B1* | 3/2018 | Heine | H01L 33/0095 |
| 10,276,755 | B2* | 4/2019 | Sasaki | H01L 33/62 |
| 10,516,081 | B1* | 12/2019 | Xin | H01L 33/24 |
| 10,516,084 | B2* | 12/2019 | Sasaki | H01L 33/58 |
| 10,644,190 | B2* | 5/2020 | Zhan | H01L 33/08 |
| 10,790,246 | B1* | 9/2020 | Chen | H01L 21/6835 |
| 10,930,819 | B2* | 2/2021 | Sasaki | H01L 24/95 |
| 11,088,296 | B2* | 8/2021 | Wang | H10H 20/018 |
| 11,469,132 | B2* | 10/2022 | Kim | H01L 21/6835 |
| 11,711,896 | B2* | 7/2023 | Lin | H01L 33/005 257/79 |
| 12,068,178 | B2* | 8/2024 | Kim | H01L 21/67333 |
| 12,199,222 | B2* | 1/2025 | Wang | H10H 20/818 |
| 12,230,617 | B2* | 2/2025 | Shim | H10H 29/03 |
| 2001/0031514 | A1* | 10/2001 | Smith | G02F 1/1362 257/E21.705 |
| 2002/0070909 | A1* | 6/2002 | Asano | H10K 59/35 345/76 |
| 2004/0037333 | A1* | 2/2004 | Onozawa | H01S 5/0233 |
| 2004/0056268 | A1* | 3/2004 | Onozawa | H01L 24/95 257/89 |
| 2004/0063233 | A1* | 4/2004 | Onozawa | H01L 21/6835 257/E21.705 |
| 2004/0089932 | A1* | 5/2004 | Craig | H01L 24/24 257/E29.022 |
| 2006/0014322 | A1* | 1/2006 | Craig | H01L 24/19 257/E21.705 |
| 2006/0048384 | A1* | 3/2006 | Ricks | H01L 24/95 257/E21.705 |
| 2006/0057293 | A1* | 3/2006 | Sharma | H01L 25/50 257/E21.705 |
| 2006/0220988 | A1* | 10/2006 | Hillis | H01L 24/95 345/30 |
| 2007/0052636 | A1* | 3/2007 | Kalt | G09G 3/34 345/83 |
| 2007/0079571 | A1* | 4/2007 | Schatz | H01L 24/95 52/503 |
| 2007/0147044 | A1* | 6/2007 | Takenaka | H01L 25/0753 257/E25.02 |
| 2007/0158804 | A1* | 7/2007 | Hosoya | H01L 24/95 257/684 |
| 2007/0215273 | A1* | 9/2007 | Jacobs | H01L 25/50 156/297 |
| 2008/0023687 | A1* | 1/2008 | Choi | H10H 20/018 257/E33.059 |
| 2010/0060553 | A1* | 3/2010 | Zimmerman | H01L 25/0753 345/60 |
| 2010/0128069 | A1* | 5/2010 | Hillis | G09F 9/33 445/24 |
| 2012/0049204 | A1* | 3/2012 | Lai | H01L 25/0753 257/E33.059 |
| 2013/0214302 | A1* | 8/2013 | Yeh | H01L 25/0753 438/27 |
| 2014/0339495 | A1* | 11/2014 | Bibl | H01L 33/502 257/13 |
| 2015/0041836 | A1* | 2/2015 | Saito | H01L 27/15 257/89 |
| 2015/0155445 | A1* | 6/2015 | Zhan | H01L 33/0075 269/21 |
| 2016/0043291 | A1* | 2/2016 | Gebuhr | H10H 20/854 257/676 |
| 2016/0380158 | A1* | 12/2016 | Sasaki | H01L 24/95 257/89 |
| 2017/0036342 | A1* | 2/2017 | Chen | B25J 15/008 |
| 2017/0133550 | A1 | 5/2017 | Schuele et al. | |
| 2017/0133558 | A1* | 5/2017 | Sasaki | H10K 59/00 |
| 2017/0236807 | A1* | 8/2017 | Hwang | H01L 33/0075 257/90 |
| 2017/0372927 | A1* | 12/2017 | Schuele | H01L 29/0657 |
| 2018/0006011 | A1* | 1/2018 | Ninan | H01L 27/0207 |
| 2018/0076352 | A1* | 3/2018 | Heine | H01L 33/005 |
| 2018/0090058 | A1* | 3/2018 | Chen | G09G 3/32 |
| 2018/0102352 | A1* | 4/2018 | Sasaki | H10H 29/14 |
| 2018/0138355 | A1* | 5/2018 | Zhan | H01L 33/04 |
| 2018/0145207 | A1* | 5/2018 | Heine | H01L 25/0753 |
| 2018/0166416 | A1* | 6/2018 | Op de Beeck | H01L 23/3121 |
| 2018/0240378 | A1* | 8/2018 | Chen | G09G 3/32 |
| 2018/0240937 | A1* | 8/2018 | Park | H01L 25/0753 |
| 2018/0323356 | A1* | 11/2018 | Lin | H01L 23/49838 |
| 2019/0006564 | A1* | 1/2019 | Sasaki | H01L 33/62 |
| 2019/0080970 | A1 | 3/2019 | Chaji | |
| 2019/0096774 | A1* | 3/2019 | Chaji | H01L 24/95 |
| 2019/0115503 | A1* | 4/2019 | Lo | H01L 21/673 |
| 2019/0181060 | A1* | 6/2019 | Pappas | H01L 22/22 |
| 2019/0189495 | A1* | 6/2019 | Wu | H01L 33/0093 |
| 2019/0304817 | A1* | 10/2019 | Ahn | B65G 47/92 |
| 2019/0318951 | A1* | 10/2019 | Chang | H01L 21/6835 |
| 2019/0357395 | A1* | 11/2019 | Ahn | H01L 33/08 |
| 2020/0006613 | A1* | 1/2020 | Sasaki | H01L 33/0095 |
| 2020/0043760 | A1* | 2/2020 | He | H01L 21/6835 |
| 2020/0058533 | A1* | 2/2020 | Zou | H01L 27/156 |
| 2020/0070364 | A1* | 3/2020 | Ahn | H01L 21/6838 |
| 2020/0118931 | A1* | 4/2020 | Garner | H01L 24/25 |
| 2020/0185368 | A1* | 6/2020 | Park | H01L 33/0093 |
| 2020/0243358 | A1* | 7/2020 | Kwag | H01L 33/62 |
| 2020/0343230 | A1* | 10/2020 | Sizov | H01L 25/0753 |

(56) References Cited

U.S. PATENT DOCUMENTS

| | | | | |
|---|---|---|---|---|
| 2020/0357779 A1* | 11/2020 | Kwag | ................ | H01L 25/0753 |
| 2021/0184070 A1* | 6/2021 | Hwang | ................ | H01L 27/156 |
| 2021/0233795 A1* | 7/2021 | Wang | ................ | H01L 22/20 |
| 2022/0013400 A1* | 1/2022 | Hwang | ................ | H01L 25/0753 |
| 2022/0018520 A1* | 1/2022 | Greco | ................ | C09K 11/883 |
| 2022/0029046 A1* | 1/2022 | Hong | ................ | H01L 33/0095 |
| 2022/0051924 A1* | 2/2022 | Kim | ................ | H01L 25/0753 |
| 2022/0077120 A1* | 3/2022 | Hong | ................ | H01L 33/62 |
| 2022/0077346 A1* | 3/2022 | Hwang | ................ | H01L 33/12 |
| 2022/0122953 A1* | 4/2022 | Hwang | ................ | H01L 24/97 |
| 2022/0123046 A1* | 4/2022 | Behringer | ................ | H01L 33/20 |
| 2022/0139887 A1* | 5/2022 | Kim | ................ | H01L 25/167 |
| | | | | 257/89 |
| 2022/0140185 A1* | 5/2022 | Lin | ................ | H05K 1/181 |
| | | | | 257/79 |
| 2022/0189810 A1* | 6/2022 | Hwang | ................ | H01L 21/68 |
| 2022/0189814 A1* | 6/2022 | Yamada | ................ | H01L 21/6835 |
| 2022/0189931 A1* | 6/2022 | Hwang | ................ | H01L 25/0753 |
| 2022/0190193 A1* | 6/2022 | Hong | ................ | H01L 33/005 |
| 2022/0190223 A1* | 6/2022 | Hwang | ................ | H01L 33/46 |
| 2022/0216187 A1* | 7/2022 | Fan | ................ | H01L 24/81 |
| 2022/0246584 A1* | 8/2022 | Hwang | ................ | H01L 33/005 |
| 2022/0262667 A1* | 8/2022 | Kim | ................ | H01L 25/0753 |
| 2022/0285188 A1* | 9/2022 | Kim | ................ | H01L 33/20 |
| 2022/0285581 A1* | 9/2022 | Hong | ................ | H01L 25/0753 |
| 2022/0328733 A1* | 10/2022 | Hwang | ................ | H01L 25/0753 |
| 2022/0328737 A1* | 10/2022 | An | ................ | H01L 33/08 |
| 2022/0344533 A1* | 10/2022 | Hwang | ................ | H01L 33/005 |
| 2023/0006099 A1* | 1/2023 | Kim | ................ | H01L 33/0093 |
| 2023/0057601 A1* | 2/2023 | Sasaki | ................ | H01L 25/50 |
| 2023/0106525 A1* | 4/2023 | Kim | ................ | H01L 21/68 |
| | | | | 438/324 |
| 2023/0109184 A1* | 4/2023 | Hong | ................ | H01L 33/62 |
| | | | | 257/91 |
| 2023/0130620 A1* | 4/2023 | Do | ................ | H01L 25/0753 |
| | | | | 257/89 |
| 2023/0131855 A1* | 4/2023 | Kim | ................ | H01L 33/24 |
| | | | | 257/79 |
| 2023/0141485 A1* | 5/2023 | Kim | ................ | H01L 21/6835 |
| | | | | 257/88 |
| 2023/0154903 A1* | 5/2023 | Dai | ................ | H01L 25/0753 |
| | | | | 257/79 |
| 2023/0178411 A1* | 6/2023 | Zhao | ................ | H01L 21/6835 |
| | | | | 345/206 |

FOREIGN PATENT DOCUMENTS

| | | |
|---|---|---|
| JP | 3844061 B2 | 11/2006 |
| KR | 10-2018-0038223 A | 4/2018 |
| KR | 10-1961834 B1 | 3/2019 |
| KR | 10-2019-0070588 A | 6/2019 |
| KR | 10-2020-0026838 A | 3/2020 |
| KR | 10-2158975 B1 | 9/2020 |

OTHER PUBLICATIONS

Communication dated Dec. 31, 2024, issued by the Korean Patent Office in Korean Application No. 10-2021-0075636.

* cited by examiner

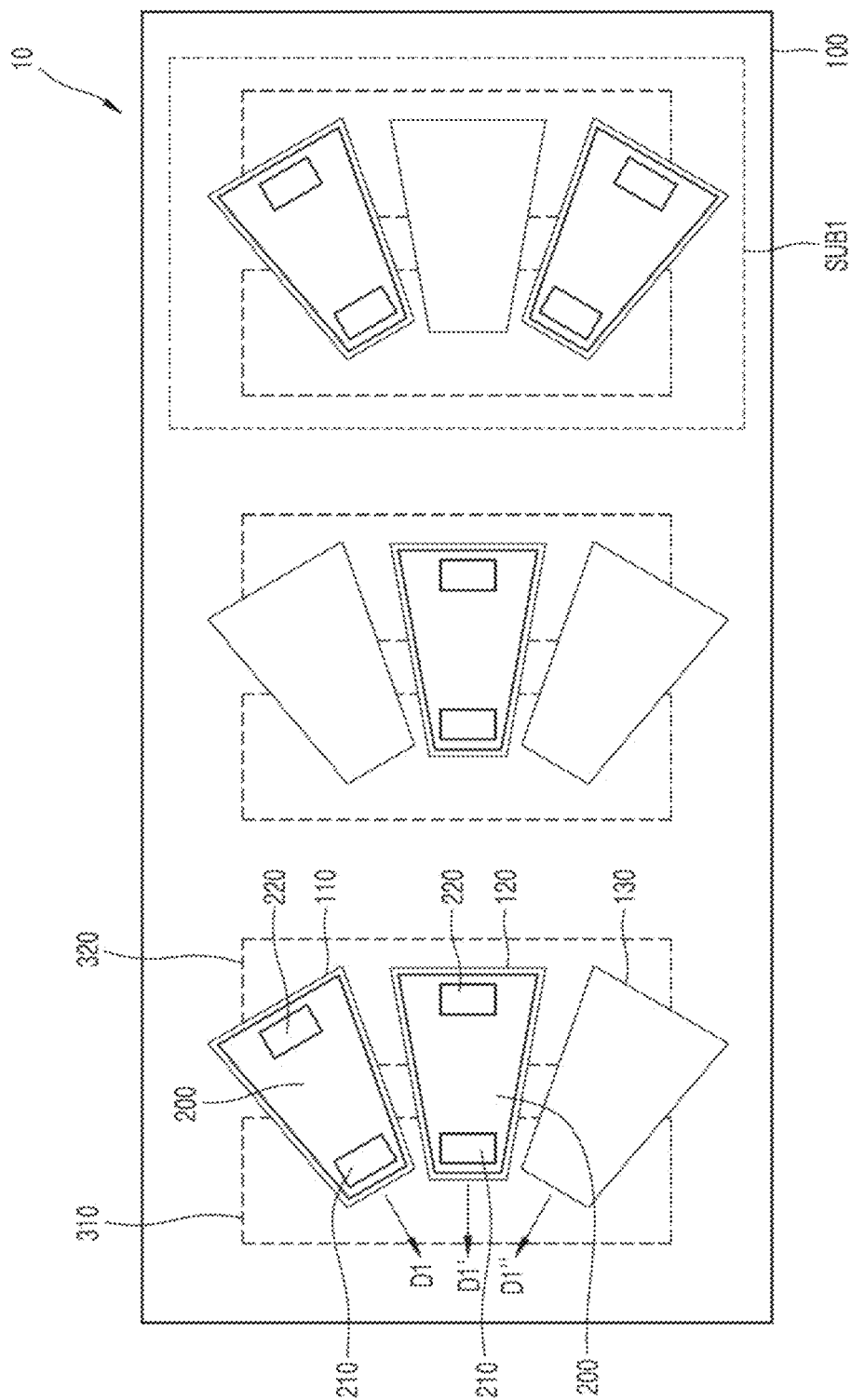

DISPLAY TRANSFER STRUCTURE INCLUDING LIGHT EMITTING ELEMENTS AND TRANSFERRING METHOD OF LIGHT EMITTING ELEMENTS

CROSS-REFERENCE TO RELATED APPLICATIONS

This application is based on and claims benefit of U.S. Provisional Application No. 63/155,477, filed on Mar. 2, 2021, in the United States Patent and Trademark Office, and claims priority under 35 U.S.C. § 119 to Korean Patent Application No. 10-2021-0075636, filed on Jun. 10, 2021, in the Korean Intellectual Property Office, the disclosures of which are incorporated by reference herein in their entireties.

BACKGROUND

1. Field

Example embodiments of the present disclosure relate to a display transfer structure including a light emitting element and a light emitting element transferring method.

2. Description of Related Art

A recent prototype light emitting diode (LED) display is a display with a self-luminous structure in which a μm unit light emitting element is mounted on a pixel position of a driving substrate, and has advantages such as high brightness, high power efficiency, long lifespan, and implementation of various form factors. The micro LED display may have characteristics of high efficiency, high image quality, and high resolution compared to existing LCD or OLED displays.

The transfer process of locating the micro LED in the μm unit at the pixel position of the driving substrate is performed by a pick and place method, but this method is difficult to guarantee productivity and economic feasibility. For example, even when only 0.1% of defects occur in the process, the number of transferred micro LEDs is large, so that there is a problem in additionally transferring hundreds or more of micro LEDs individually. Therefore, in order to manufacture a large-area micro LED display, there is a need to develop another method.

In addition, as the size of the micro LED decreases, it is advantageous in terms of economy, but as the size of the micro LED decreases, the electrode interval between the p-electrode and the n-electrode formed in the micro LED also decreases, and there is a problem in that the possibility of a defect due to an alignment error increases during a bonding or metallization process for connecting the electrodes later.

SUMMARY

One or more example embodiments provide a display transfer structure to which a light emitting element with a rotationally asymmetric shape is transferred.

One or more example embodiments also provide a method of transferring a light emitting element including a rotationally asymmetric shape is provided.

Additional aspects will be set forth in part in the description which follows and, in part, will be apparent from the description, or may be learned by practice of example embodiments of the disclosure.

According to an aspect of an example embodiment, there is provided a display transfer structure including a substrate including a plurality of wells, and a plurality of light emitting elements disposed in the plurality of wells, wherein the plurality of light emitting elements have a rotationally asymmetric planar shape, and wherein the plurality of wells respectively have a planar shape different from a planar shape of each of the plurality of light emitting elements.

A first well of the plurality of wells may include a first area and a second area partially overlapping each other, and a first light emitting element among the plurality of light emitting elements may be disposed in the first area or the second area.

The first area and the second area respectively may have a planar shape corresponding to a planar shape of the first light emitting element.

The first area of the first well may be oriented in a first direction, wherein the second area of the first well may be oriented in a second direction, and wherein the first light emitting element may be oriented in a direction of the first direction or the second direction based on the first area or the second area in which the first light emitting element is disposed.

The first well may further include a third area partially overlapping with the second area, the first light emitting element may be disposed in the first area, and a second light emitting element among the plurality of light emitting elements may be disposed in the third area.

At least one of the plurality of light emitting elements may include a first electrode and a second electrode spaced apart from each other, a plurality of first electrode pads and a plurality of second electrode pads may be disposed on the substrate and spaced apart from each other, a first electrode pad among the plurality of first electrode pads may be electrically connected to the first electrode, and a second electrode pad among the plurality of second electrode pads may be electrically connected to the second electrode.

A first well and a second well among the plurality of wells that are adjacent to each other may be included in a subpixel.

The first well and the second well may be rotationally symmetric with respect to a predetermined central axis perpendicular to the substrate, and a first electrode pad and a second electrode pad disposed in the first well may be rotationally symmetrical to a first pad and a second electrode pad disposed in the second well with respect to the predetermined central axis.

The first well and the second well may be disposed in an arc shape with respect to a predetermined central axis perpendicular to the substrate, and a first electrode pad and a second electrode pad of the substrate may have an arc shape or ring shape with respect to the predetermined central axis.

A first well among the plurality of wells may include a first area and a second area partially overlapping each other, the second area is an area in which the first area may be rotated by a first angle in a counter-clockwise direction with respect to a specific rotation point, and a first light emitting element among the plurality of light emitting elements may be disposed on an area where the first area and the second area overlap.

The first area may be oriented in a first direction, the second area may be oriented in a second direction in which the first direction is rotated by the first angle, the first light emitting element may be oriented and disposed in a direction rotated by a second angle from the first direction, and the second angle may be an angle between 0 degrees and the first angle.

A first well among the plurality of wells may include a first area and a second area partially overlapping each other, the second area may be an area in which the first area is moved in parallel by a first distance in a specific direction, a first light emitting element among the plurality of light emitting elements may be disposed on an area where the first area and the second area overlap, the first area and the second area may be oriented in a first direction, and the first light emitting element may be oriented and disposed in the first direction.

The plurality of light emitting elements may include a first light emitting element having a tapered planar shape, the plurality of wells may include a first well having a tapered planar shape with taper per inch equal to or greater than taper per inch of the planar shape of the first light emitting element, and a smaller surface and a larger surface among surfaces intersecting a taper centerline of the first light emitting element may be respectively disposed to face a smaller surface and a larger surface among surfaces intersecting a taper centerline of the first well.

A first well among the plurality of wells may have a circular shape, a first light emitting element among the plurality of light emitting elements may be disposed in the first well, a diameter of the circular shape may be greater than a maximum length of the first light emitting element, and a distance between a first electrode and a second electrode included in the first light emitting element may be greater than a distance between a center of the first well and the second electrode.

A plane of at least one light emitting element among the plurality of light emitting elements may have a trapezoidal shape, a center cut sector shape, or a polygonal shape.

A planar shape of at least one light emitting element among the plurality of light emitting elements may be a trapezoidal shape or a sector shape that is cut at a center, and a first electrode and a second electrode may be disposed on different areas of the at least one light emitting element based on a taper centerline of the at least one light emitting element.

A planar shape of at least one light emitting element among the plurality of light emitting elements may have a line asymmetric shape.

The plurality of wells may include a third well and a fourth well having different shapes, each of the plurality of light emitting elements may include a third light emitting element disposed in the third well, and a fourth light emitting element having a shape different from a shape of the third light emitting element and disposed in the fourth well.

According to another aspect of an example embodiment, there is provided a display transfer structure including a substrate including a plurality of wells, and a plurality of light emitting elements disposed in the plurality of wells, wherein the plurality of light emitting elements have a rotationally asymmetric planar shape, wherein a first well and a second well among the plurality of wells that are adjacent to each other are included in a subpixel, wherein the first well is oriented in a first direction and the second well is oriented in a second direction different from the first direction, wherein one of the plurality of light emitting elements disposed in the first well is oriented in the first direction, and wherein the other one of the light emitting elements disposed in the second well is oriented in the second direction.

According to another aspect of an example embodiment, there is provided a light emitting element transferring method including preparing a substrate including a plurality of wells, and transferring a plurality of light emitting elements having a rotationally asymmetric planar shape to the plurality of wells, wherein the plurality of wells respectively have a planar shape different from a shape of each of the plurality of light emitting elements, wherein a first well of the plurality of wells includes a first area and a second area partially overlapping each other, and wherein the transferring of the plurality of light emitting elements includes inserting a first light emitting element among the plurality of light emitting elements into the first area in a first direction or into the second area in a second direction.

According to another aspect of an example embodiment, there is provided a display transfer structure including a substrate including a plurality of wells, and a plurality of light emitting elements disposed in the plurality of wells, wherein the plurality of light emitting elements have a rotationally asymmetric planar shape, and wherein at least two of the plurality of wells are disposed at different orientations from each other.

BRIEF DESCRIPTION OF THE DRAWINGS

The above and/or other aspects, features, and advantages of example embodiments of the disclosure will be more apparent from the following description taken in conjunction with the accompanying drawings, in which:

FIG. 19A is a schematic diagram showing a display transfer structure according to an example embodiment;

DETAILED DESCRIPTION

Figure 1:
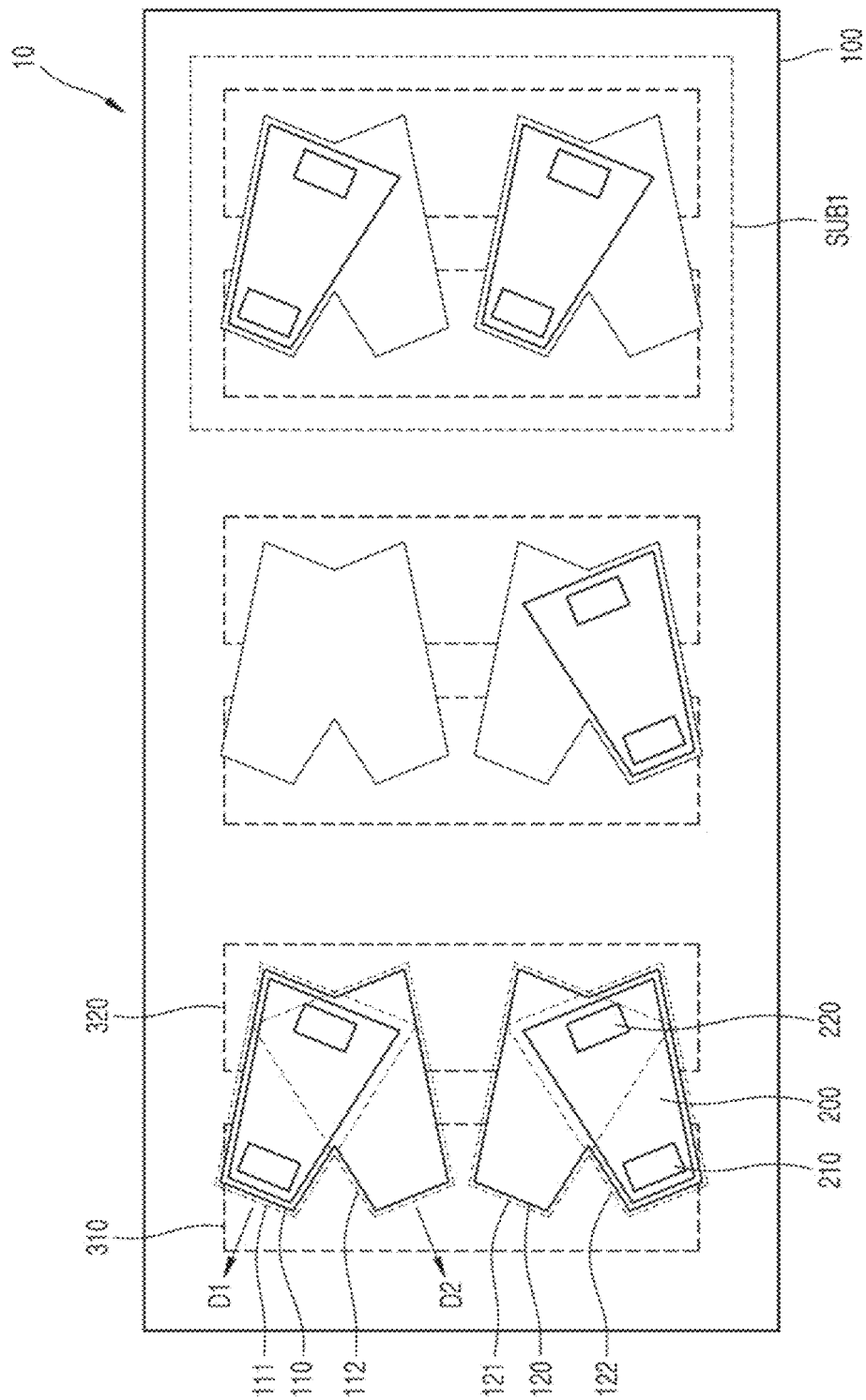
FIG. 1 is a schematic diagram showing that light emitting elements are disposed on a substrate in a display transfer structure according to an example embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, example embodiments will be described in detail with reference to the accompanying drawings. The example embodiments described below are merely examples, and various modifications are possible from these embodiments. In the following drawings, the same reference numerals refer to the same components, and the size of each component in the drawings may be exaggerated for clarity and convenience of description.

Hereinafter, what is described as "upper part" or "on" may include not only those directly above by contact, but also those above non-contact.

The terms of a singular form may include plural forms unless otherwise specified. In addition, when a certain part "includes" a certain component, other components may be further included rather than excluding other components unless otherwise stated.

The use of the term "the" and similar designating terms may correspond to both the singular and the plural.

The use of the term "connection" may include not only a physical connection, but also an optical connection, an electrical connection, and the like.

In addition, the use of all example terms (e.g., etc.) is merely for describing the technical idea in detail, and unless it is limited by the claims, the scope of rights is not limited by these terms.

Terms such as first, second, etc. may be used to describe various components, but the components should not be limited by the terms. The terms are used only for the purpose of distinguishing one component from another.

The planar shape may be a device shape on a top plan view of the device.

Rotational asymmetric planar shape may be the planar shape is not the same as the initial planar shape when a specific shape is rotated by an angle of less than 360 degrees with respect to the central axis and may be having the same planar shape as the initial planar shape only when it is rotated 360 degrees. For example, a circle, an equilateral triangle, a square, a rectangle, etc. have a planar shape that is symmetrical within 360 degrees upon rotation, but a sector, a trapezoid, etc. do not have a planar shape that is symmetrical within 360 degrees upon rotation.

A line asymmetry planar shape may be that with respect to an arbitrary straight line laid on the planar shape, both sides are asymmetric with respect to the straight line.

The first direction, the second direction, etc. may indicate an orientation direction of a specific well or an orientation direction of a planar shape of a light emitting element positioned in a specific well. When rotating a planar shape based on an arbitrary rotation point, when the plane has a rotationally asymmetric shape, the first direction and the second direction may not be the same unless the rotation angles are the same.

The first direction and the second direction may be an orientation direction of a light emitting element disposed in a specific well (e.g., the first well). The first direction without pointing out a specific well may indicate the first direction of the first well. That is, the first direction may indicate a direction in which the light emitting element is oriented when the light emitting element is disposed in the first area of the first well, and the second direction may indicate a direction in which the light emitting element is oriented when the light emitting element is disposed in the second area of the second well, respectively. Therefore, when the light emitting element is disposed in the first area of the second well, the direction in which the light emitting element is oriented may be the same as or different from the first direction (the direction in which the light emitting element is oriented when disposed in the first area of the first well).

The light emitting element, the substrate, and the well of the display transfer structure according to the example embodiment may refer to the light emitting element, the substrate, and the well of the light emitting element transferring method according to the example embodiment, respectively.

Figure 2:
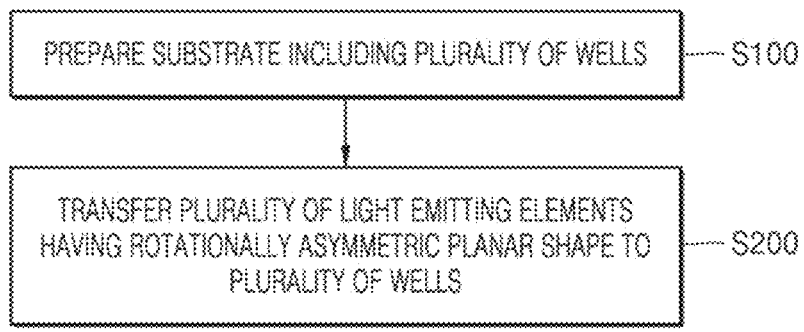
FIG. 2 is a schematic diagram showing a flowchart of a light emitting element transferring method according to an example embodiment.

FIG. 1 is a schematic diagram illustrating that a light emitting element 200 is disposed on a substrate 100 in a display transfer structure 10 according to an example embodiment, and FIG. 2 is a diagram illustrating a flowchart of a light emitting element transferring method.

Referring to FIGS. 1 and 2, the display transfer structure 10 according to an example embodiment includes a substrate 100 including a plurality of wells 110 and 120 and a plurality of light emitting elements 200 disposed in the plurality of wells 110 and 120, and the light emitting elements 200 have a rotationally asymmetric planar shape. At least one of the plurality of wells 110 or 120 includes first area 111 or 121 and second area 112 or 122 partially overlapping each other, and at least one of the plurality of light emitting elements 200 may be disposed in the first area 111 or 121 or the second area 112 or 122, and each of the plurality of wells 110 and 120 may have a shape different from the planar shape of the light emitting elements 200. The light emitting element transferring method according to an example embodiment includes preparing a substrate 100 including a plurality of wells 110 and 120 (S100) and transferring a plurality of light emitting elements 200 having a rotationally asymmetric planar shape to the plurality of wells 110 and 120 (S200). At least one of the plurality of wells 110 or 120 includes first area 111 or 121 and second areas 112 or 122 partially overlapping each other, and at least one of the plurality of the wells 110 or 120 has a shape different from the planar shape of the light emitting elements 200. In the transfer step S200, some of the light emitting element 200 in the first well 110 may be inserted into the first area 111 being oriented in the first direction D1, and some of the light emitting elements 200 may be inserted in the second area 112 being oriented in the second direction D2. As the plane of the light emitting element 200 has a shape that does not have rotational symmetry, the distance at which the first electrode 210 and the second electrode 220 located on or in the emitting element 200 are spaced apart from each other may be increased, so that the occurrence of defects due to alignment errors may be reduced. As the area occupied by the first electrode 210 and the second electrode 220 is reduced, the area for emitting the light may be increased. In addition, since the plurality of wells 110 and 120 of the substrate 100 includes a plurality of areas in where the light emitting element 200 may be disposed, the light emitting element 200 may be oriented in one of a plurality of directions, and thus transfer efficiency may be increased.

The light emitting element transfer process and the substrate 100 having the plurality of wells 110 and 120 of the display transfer structure 10 and the plurality of light emitting elements 200 according to an example embodiment will be described. The latter may correspond to the substrate 100 having the plurality of wells 110 and 120 and the plurality of light emitting elements 200 of the light emitting element transferring method according to an example embodiment.

A substrate 100 including a plurality of wells 110 and 120 is prepared (S100). The substrate 100 may be a driving substrate, or an interposer for temporarily arranging the light emitting elements 200 before transferring to the driving substrate. The substrate 100 may be a single layer, or may be a multilayer including a plurality of layers. The substrate 100 may include a plurality of wells 110 and 120, and the light emitting element 200 may be disposed in or transferred to the plurality of wells 110 and 120. Each of the plurality of wells 110 and 120 may have a shape and size in which one light emitting element 200 may be disposed, or may have a shape and size in which a plurality of light emitting elements 200 may be disposed. The shape and size of the plurality of wells 110 and 120 may have the same shape with a size slightly larger than the size of the light emitting element 200 so that the light emitting element 200 may be easily disposed or transferred.

The light emitting element 200 may be disposed in or transferred to one of the areas 111, 112, 121, or 122 included in the plurality of wells 110 or 120. One of the areas 111, 112, 121, or 122 may have a shape and size in which one light emitting element 200 may be disposed, and may have a shape and size in which a plurality of light emitting elements 200 may be disposed. The shape and size of one of the areas 111, 112, 121, or 122 may have the same shape with a size slightly larger than the size of the light emitting element 200 so that the light emitting element 200 may be easily disposed or transferred. When the plurality of wells 110 or 120 includes a plurality of areas 111 and 112 or 121 and 122 partially overlapping each other, the shapes and sizes of the plurality of wells 110 or 120 may be different from those of the light emitting element 200.

Each of the plurality of wells 110 and 120 may have the same size and shape, but in order for the light emitting element 200 having a different shape to be placed or transferred, the plurality of wells 110 and 120 may have a plurality of different shapes. For example, when the light emitting element 200 emitting red light (R), green light (G), and blue light (B) has different planar shapes, a plurality of wells may have three different planar shapes. The three light emitting elements 200 may be exclusively disposed in or transferred to a plurality of wells having three different planar shapes, respectively. Each area included in each of the plurality of wells may have the same size and shape, but embodiments are not limited thereto, and the plurality of wells may have a plurality of different shapes.

The wells 110 and 120 of the substrate 100 and the upper surfaces excluding the wells 110 and 120 may be made of different materials, and thus a difference in surface energy may occur. Due to the difference in surface energy, in one of a direction in which the electrodes 210 and 220 disposed on the light emitting element 200 face bottom of the wells 110 and 120 or a direction in which the electrodes 210 and 220 face the opening, a light emitting element 200 may be disposed in or transferred to the wells 110 and 120. Since the light emitting element 200 is disposed in the wells 110 or 120 in one direction due to a difference in surface energy, defects in electrical connection after transferring the light emitting element may be minimized.

A plurality of light emitting elements 200 having a rotationally asymmetric planar shape are supplied on the substrate 100, and at least one of the plurality of light emitting elements 200 is transferred to one of the plurality of wells 110 or 120 (S200). As a method of transferring the light emitting element 200 into the substrate 100, fluidic self assembly (FSA) may be used. The FSA may be a method in which a plurality of light emitting elements 200 are assembled at predetermined positions on the substrate 100 by supplying the plurality of light emitting elements 200 to the substrate 100, and applying an appropriate stimulus such as vibration, inclination, pressure, etc.

In the FSA, the plurality of light emitting elements 200 may be suspended in a solvent to form a suspension. The method of supplying the plurality of light emitting elements 200 on the substrate 100 may include a method of suspending the plurality of light emitting elements 200 in a suspension and supplying the suspension on the substrate 100. As a method of supplying the suspension onto the substrate 100, various methods such as a spray method, a dispensing method, an inkjet dot method, a method of flowing the suspension to the interposer, etc. may be used.

After the suspension is supplied on the substrate 100, at least one of the plurality of light emitting elements 200 may be transferred to one of the plurality of wells 110 and 120 by scanning the upper surface of the substrate 100 using, for example, a blade, a roller, or an absorber. However, the transferring method is not limited to the scanning, and various methods may be used. For example, a method of pressing the suspension from above may be included. During scanning, the light emitting element 200 may be inserted into the wells 110 and 120 only when oriented in a specific direction, and the specific direction may include plural directions.

The light emitting element 200 may include, for example, an n-type semiconductor layer, an active layer, and a p-type semiconductor layer. The n-type semiconductor layer may be, for example, an n-type gallium nitride (GaN) layer, and the p-type semiconductor layer may be a p-type GaN layer. The active layer may have, for example, a quantum well structure or a multi-quantum well structure. However, the light emitting element 200 is not limited to the above example.

The plurality of light emitting elements 200 may have a size of 1 µm to 1000 µm. For example, the plurality of light emitting elements 200 may have a size of 1 µm to 200 µm or less. Preferably, the plurality of light emitting elements 200 may have a size of 100 µm or less. In this case, the size may be the maximum length (hereinafter, the maximum length) among the lengths between two points on the light emitting element 200.

For example, when the maximum length of the light emitting element 200 is $L_M$, the maximum length of one area of the wells 110 and 120 may be the sum $(L_M+\alpha)$ of $L_M$ and $\alpha$, which is larger by the interval a than $L_M$. In this case, the interval a is to secure an interval at which the light emitting element 200 may be smoothly inserted into the area, and may be different for each size of the light emitting element 200, but for example, may be 0.1 um to 10 um. However, embodiments are not limited thereto and may be changed in consideration of tolerances and process capabilities. In addition, depending on the size of the device, the maximum length of the wells 110 and 120 may be 1% to 30% longer than the maximum length of the device, but embodiments are not limited thereto, and as long as the electrical connection between the electrodes 210 and 220 of the light emitting element 200 and the electrode pads 310 and 320 of the driving unit is smooth, a longer length may be feasible. According to another example embodiment, an interval may not be limited to only the maximum length, and the wells 110 and 120 may be formed in a shape having an interval equal to the interval a in a direction perpendicular to the circumferential line based on the perimeter of the planar shape of the light emitting element 200. According to another example embodiment, the shape of the wells 110 and 120 and the shape of the light emitting element 200 are the same, and the width of the wells 110 and 120 may be about $((L_M+\alpha)/L_M)^2$ times the width of the light emitting element 200. However, embodiments are not limited to such a size difference and may have an appropriate size difference.

As the size of the light emitting element 200 decreases, the interval (hereinafter, electrode interval) between the first electrode 210 and the second electrode 220 disposed on the light emitting element 200 may gradually decrease. For example, the light emitting element 200 having a circular plane with a size of 20 µm may include a first electrode 210 in the center and a second electrode 220 around the circle. In this case, since the first electrode 210 and the second electrode 220 also have a certain size, it may be difficult to secure an electrode interval of 5 µm or more. As the electrode interval decreases, the possibility of a defect due to an alignment error increases, so that the electrode connection may fail.

In related art, the shapes of the plurality of light emitting elements and the plurality of wells each have rotational symmetry, and in order to be connected to the electrode pad of the driving board even when being transferred in any direction, a first electrode is disposed near the center of the light emitting element, and a second electrode is disposed near the perimeter of the light emitting element. That is, in relation to a light emitting element with a rotationally symmetrical planar shape, the first electrode disposed on the light emitting element may be disposed near the center of the light emitting element, and the second electrode may be disposed near the periphery of the light emitting element. In the above case, as the size of the light emitting element decreases, the electrode interval between the first electrode and the second electrode also decreases, so that the possibility of occurrence of defects due to an alignment error may increase, and area for emitting the light may be narrowed.

However, the plurality of light emitting elements 200 of the display transfer structure 10 according to an example embodiment may have a rotationally asymmetric planar shape. When the light emitting element 200 has a rotationally asymmetric planar shape, the first electrode 210 may be disposed away from the vicinity of the center of the light emitting element 200, so that the first electrode 210 and the second electrode 220 may be disposed with a relatively large electrode interval. As the electrode interval is further secured, the light emitting element transferring method according to the example embodiment may reduce the possibility of occurrence of defects due to an alignment error and further secure an area for emitting the light. For example, the electrode interval may be greater than half the maximum length of the light emitting element 200. As the electrode interval is further secured, defects of the display transfer structure 10 according to the example embodiment may be reduced, and the brightness may be further improved.

At least one of the plurality of wells 110 or 120 may include a plurality of areas, and one area among the plurality of areas and the other area among the remaining areas may partially overlap, or may not overlap. As described above, one area among the plurality of areas and the light emitting element 200 may have the same shape, and one area may have the same size as the light emitting element 200, or may have a size slightly larger than the size of the light emitting element 200. The light emitting element 200 may be disposed in one of a plurality of areas, and the disposed light emitting element 200 may be oriented in one direction, and may not be oriented in another direction other than one direction. For example, the light emitting element 200 may not be inserted in a direction other than one direction during transfer. For example, the well 110 or 120 may include first area 111 or 121 and second area 112 or 122 that partially overlap each other, and the light emitting element 200 may be disposed in the first area 111 or 121 or the second area 112 or 122. In this case, the light emitting element 200 disposed in the first area 111 of the first well 110 may be oriented in the first direction D1, and the light emitting element 200 disposed in the second area 112 may be oriented in the second direction D2.

As the wells 110 and 120 include a plurality of areas, the shape of the wells 110 and 120 and the shape of the light emitting element 200 may be different. For example, the first well 110 includes a first area 111 into which the light emitting element 200 is inserted in the first direction D1 and a second area 112 into which the light emitting element 200 is inserted in the second direction D2, and the first area 111 and the second area 112 may partially overlap. In this case, the light emitting element 200 may be inserted into the first well 110 only when oriented in the first direction D1 or the second direction D2. As the wells 110 or 120 include the first area 111 or 121 and the second areas 112 or 122 that partially overlap each other, the shape of the wells 110 or 120 and the shape of the light emitting element 200 may be different.

The first direction D1 and the second direction D2 may be different from or the same as each other. When the first direction D1 and the second direction D2 are the same direction, since the first area 111 or 121 and the second area 112 or 122 partially overlap, the second areas 112 or 122 may be moved in parallel from the first area 111 or 121. For example, the second area 112 or 122 may move in parallel from the first area 111 or 121 in a certain direction. When the first direction D1 and the second direction D2 are different directions, the second area 112 122 may be obtained by rotating the first area 111 or 121 based on an arbitrary central axis perpendicular to the substrate 100. For example, the second area 112 or 122 of FIG. 1 is rotated based on an arbitrary central axis in the area of the second electrode 220. The second area 112 or 122 may be rotated and moved in parallel of the first area 111 or 121.

The light emitting element 200 of the display transfer structure 10 according to an example embodiment may include a first electrode 210 and a second electrode 220 that are spaced apart from each other. In this case, the first electrode 210 and the second electrode 220 may be disposed in or on the same plane shape of the light emitting element 200. In addition, the display transfer structure 10 according to the example embodiment may include a plurality of first electrode pads 310 and a plurality of second electrode pads 320. Some of the plurality of first electrode pads 310 may be connected to each other, and some of the plurality of second electrode pads may be connected to each other. The plurality of first electrode pads 310 and the plurality of second electrode pads 320 may be disposed to be spaced apart from each other. The first electrode pad 310 may be electrically connected to the first electrode 210 through various methods, and the second electrode pad 320 may be electrically connected to the second electrode 220 through various methods. For example, each of the electrode pads 310 and 320 and the electrodes 210 and 220 may be attached and electrically connected through soldering, anisotropic conductive film (ACF), connection using a conductive wire, or the like. After the transfer step S200, a step of connecting each of the first electrode pads 310 and the first electrodes 210 and a step of connecting each of the second electrode pads 320 and the second electrodes 220 may be included in the transferring method.

Figure 3:
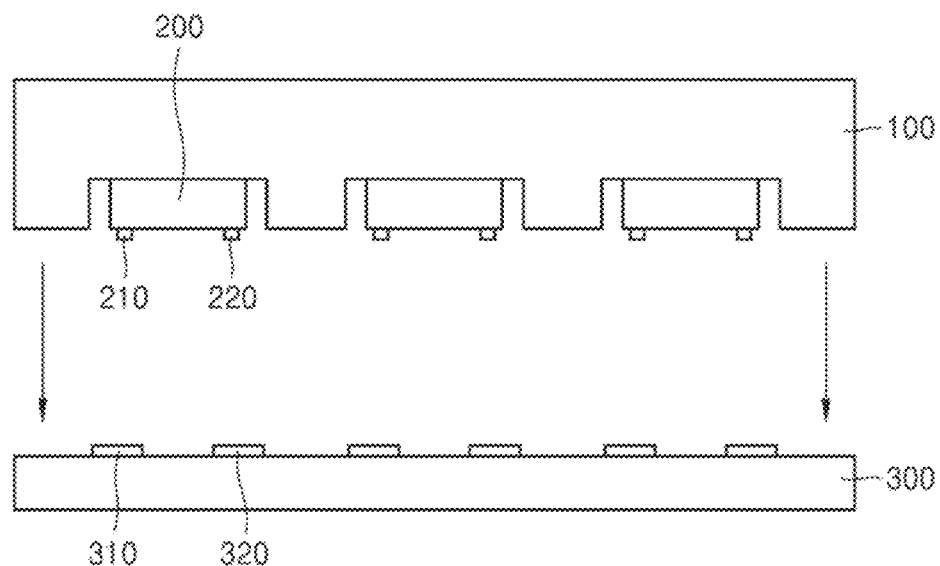
FIG. 3 is a diagram illustrating electrode pads disposed on another substrate according to an example embodiment.
Figure 4:
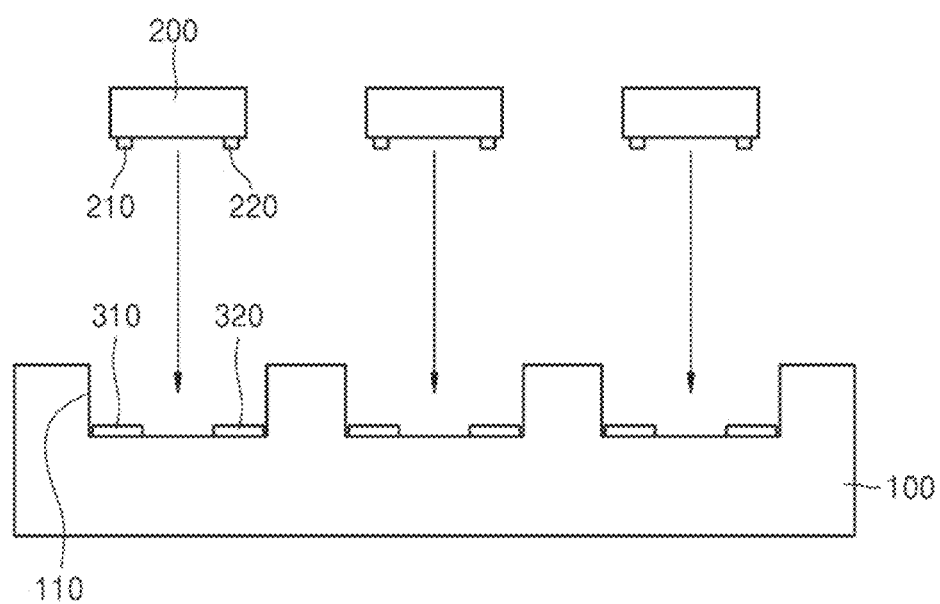
FIG. 4 is a diagram illustrating electrode pads disposed in a portion of a well according to an example embodiment.

FIG. 3 is a diagram illustrating that the electrode pads 310 and 320 are disposed on a substrate 300, and FIG. 4 is a diagram illustrating that the electrode pads 310 and 320 are disposed in a portion of the wells 110 and 120 disposed in the substrate 100.

Referring to FIGS. 3 and 4, the first electrode pad 310 and the second electrode pad 320 may be disposed in portions of the wells 110 and 120, respectively. The first electrode pad 310 and the second electrode pad 320 may be embedded in the substrate 100 and exposed to a portion of the wells 110 and 120. According to another example embodiment, the first electrode pad 310 and the second electrode pad 320 may be disposed on a substrate 300 different from the substrate 100 to cover the opening. When the first electrode 210 of the light emitting element 200 is positioned in an area that may be electrically connected to the first electrode pad 310, the first electrode pad 310 and the first electrode 210 may be electrically connected to each other. When the second electrode 220 of the light emitting element 200 is positioned in an area that may be electrically connected to the second electrode pad 320, the second electrode pad 320 and the second electrode 220 may be electrically connected to each other. The first electrode pad 310 and the second electrode pad 320 are spaced apart, and an area electrically connectable by the first electrode pad 310 and an area electrically connectable by the second electrode pad 320 may be mutually exclusive.

The first electrode pad 310 and the second electrode pad 320 of FIG. 1 may be disposed in respective portions of the wells 110 and 120, or may be disposed on a substrate 300 separate from the substrate 100 to cover respective portions of the wells 110 and 120. Referring to FIG. 1, the first electrode pad 310 and the first electrode 210 of the light emitting element 200 may be electrically connected, and the second electrode pad 320 and the second electrode 220 of the light emitting element 200 may be electrically connected.

A point where the first electrode 210 is located when the light emitting element 200 is oriented in the first direction D1 and inserted into the first well 110 of the substrate 100 (when disposed in the first area 111) and a point where the first electrode 210 is located when the light emitting element 200 is oriented in the second direction D2 and inserted into the first well 110 of the substrate 100 (i.e., when disposed in the second area 112) may be included in an area that may be electrically connected to the first electrode pad 310. Similarly, a point where the second electrode 220 is located when the light emitting element is inserted into the first well 110 of the substrate 100 in the first direction D1 (when disposed in the first area 111) and a point where the second electrode 220 is located when the light emitting element 200 is inserted into the first well 110 of the substrate 100 in the second direction D2 (when disposed in the second area 112) may be included in an area that may be electrically connected to the second electrode pad 320.

When the light emitting element 200 is arranged in any one direction, a point where the first electrode 210 is located is included in an area that may be electrically connected to the first electrode pad 310, and a point where the second electrode 220 is located is included in an area that may be electrically connected to the second electrode pad 320, the first well 110 may be formed to further include an area corresponding to one direction thereof. However, it may be assumed that a condition in which the light emitting element 200 is only inserted in the first direction D1, the second direction D2, or the one direction other than other directions due to the inclusion of the arbitrary area is satisfied.

Referring to FIG. 1, the adjacent first and second wells 110 and 120 among the plurality of wells 110 and 120 of the display transfer structure 10 may be included in one subpixel SUB1. One or more light emitting elements 200 inserted into the wells 110 and 120 in one subpixel SUB1 may emit light of the same color. Although the first well 110 and the second well 120 of FIG. 1 are illustrated as having the same shape, embodiments are not limited thereto, and the first well 110 and the second well 120 may have different shapes. At least one light emitting element 200 may be transferred to one subpixel SUB1. Even when only one light emitting element 200 is transferred to one subpixel SUB1 including the plurality of wells 110 and 120, the subpixel SUB1 may operate normally, so that the transfer yield may be increased.

Figure 5:
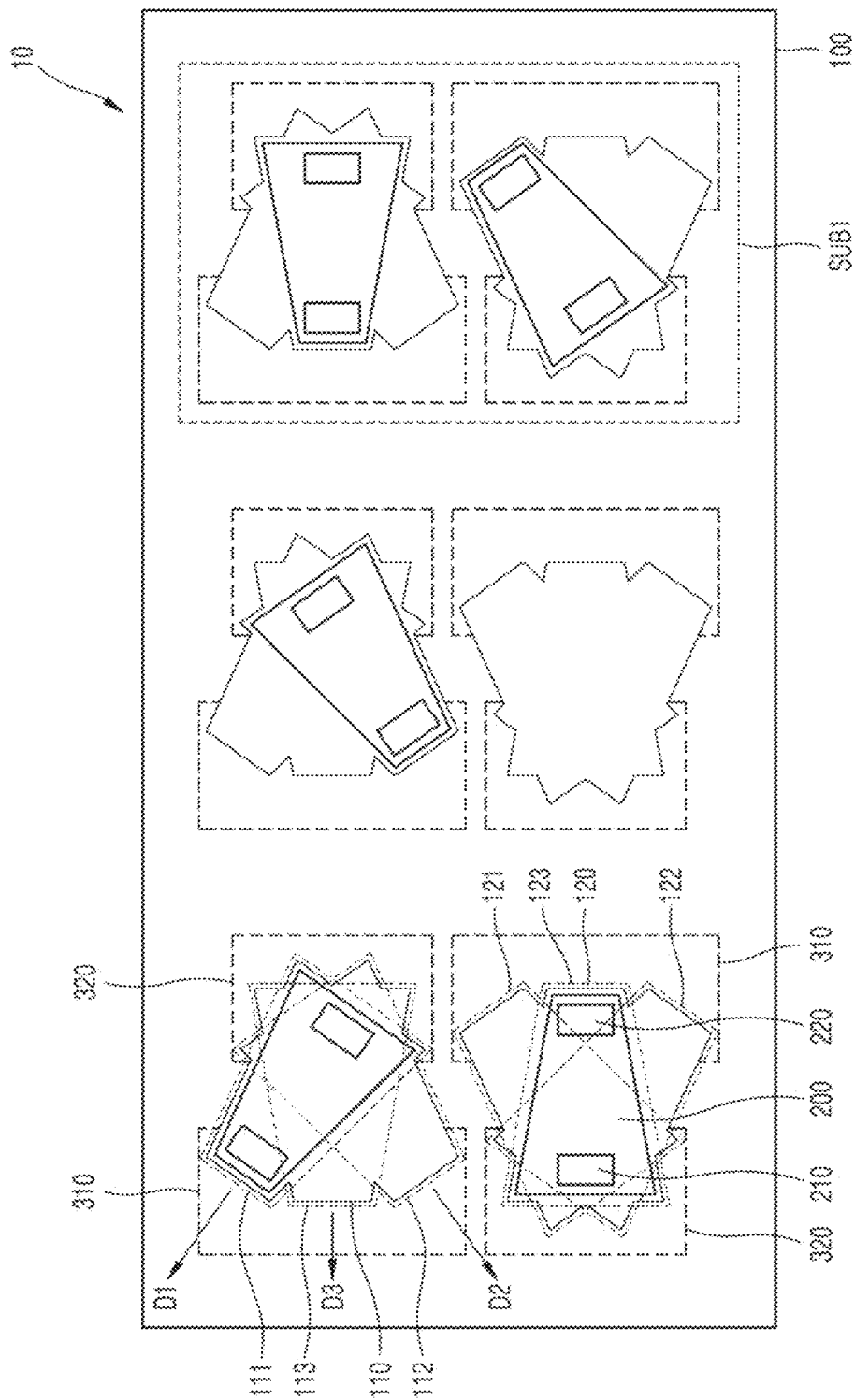
FIG. 5 is a diagram illustrating a display transfer structure in which the arrangement direction of electrode pads connected to a first well and the direction of electrode pads connected to a second well of the display transfer structure are opposite to each other in the display transfer structure according to an example embodiment.

FIG. 5 is a schematic diagram showing the display transfer structure 10 in which the arrangement direction of the electrode pads 310 and 320 connected to the first well 110 and the arrangement direction of the electrode pads 310 and 320 connected to the second well 120 are opposite to each other.

Referring to FIGS. 1 and 5, the electrode pads arrangement direction of the first electrode pad 310 and the second electrode pad 320 disposed in the first well 110 and the electrode pads arrangement direction of the first electrode pad 310 and the second electrode pad 320 disposed in the second well 120 may be the same or different. For example, as in FIG. 1, when the first well 110 and the second well 120 have the same shape and the two wells 110 and 120 are vertically arranged in parallel, a first electrode pad 310 may be disposed on the left side of the first well 110, and a second electrode pad 320 may be disposed on the right side of the first well 110. The first electrode pad 310 and the second electrode pad 320 may extend vertically and be disposed in the second well 120 in the same manner as the first well 110. At this time, the electrode arrangement direction of the first electrode pad 310 and the second electrode pad 320 disposed in the first well 110 and the electrode arrangement directions of the first electrode pad 310 and the second electrode pad 320 disposed in the second well 120 may be the same. According to another example, as shown in FIG. 5, when the second well 120 has 180 degree rotational symmetry with respect to the first well 110, and the two wells 110 and 120 are vertically arranged, the first electrode pad 310 may be disposed on the left side of the first well 110, and the second electrode pad 320 may be disposed on the right side of the first well 110. In this case, the second electrode pad 320 may be disposed on the left side of the second well 120, and the first electrode pad 310 may be disposed on the right side of the second well 120. In this case, the arrangement direction of the electrode pad disposed in the first well 110 and the arrangement direction of the electrode pad disposed in the second well 120 may be opposite to each other or 180 degrees rotationally symmetric. The first electrode pad 310 of the first well 110 and the first electrode pad 310 of the second well 120 may be disposed diagonally and may be connected to each other, and the second electrode pad 320 of the first well 110 and the second electrode pad 320 of the first well 110 may also be disposed diagonally and may be connected to each other. The above 180 degree rotational symmetry is not limited to this as an example, and when the first well 110 and the second well 120 are rotationally symmetric with respect to a specific central axis perpendicular to the substrate, the first electrode pad 310 and the second electrode pad 320 disposed in the first well 110 may be rotationally symmetric with the first electrode pad 310 and the second electrode pad 320 disposed in the second well 120 with respect to the central axis.

Figure 6:
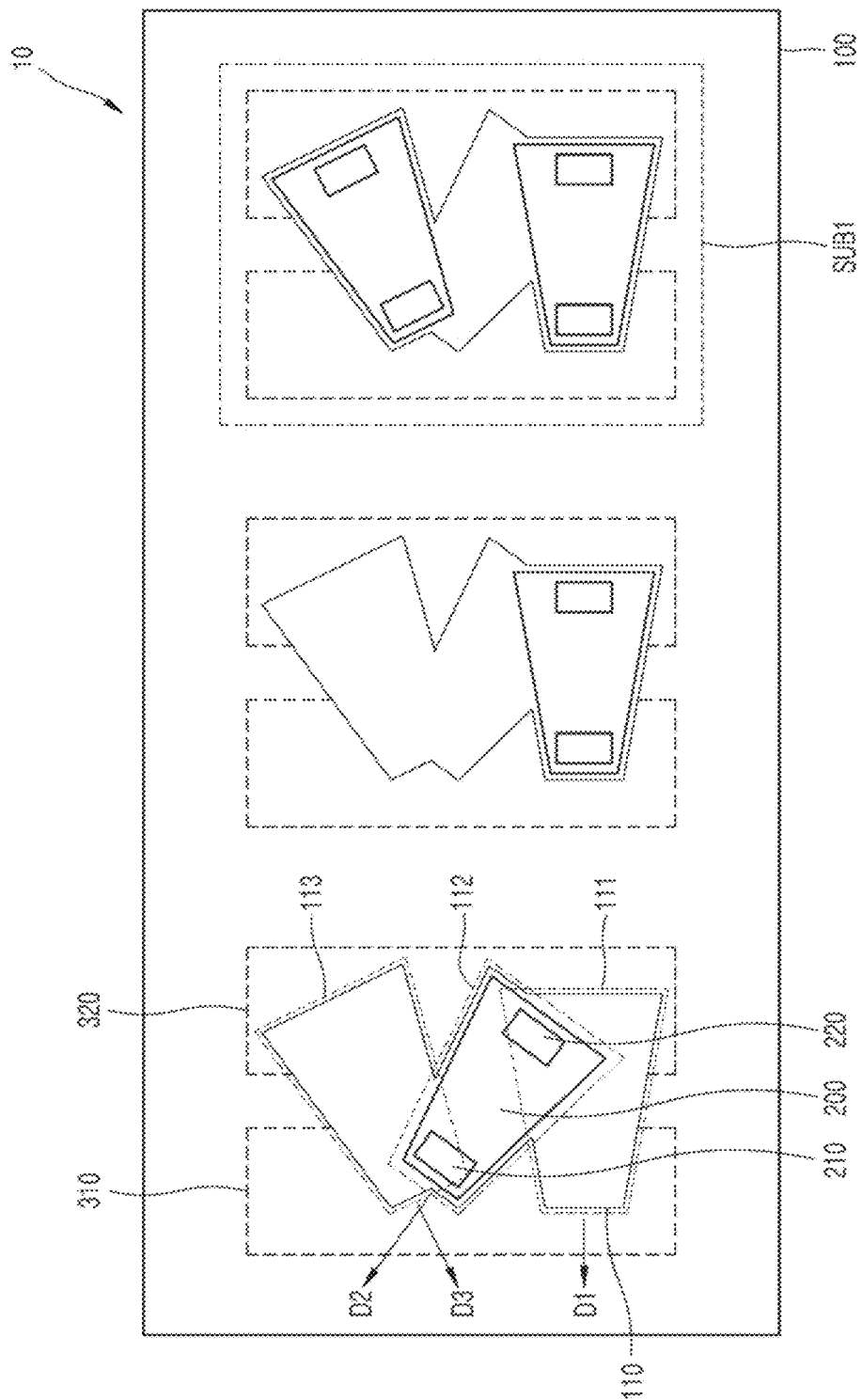
FIG. 6 is a diagram showing that the well of a display transfer structure further includes a third area according to an example embodiment.
Figure 7:
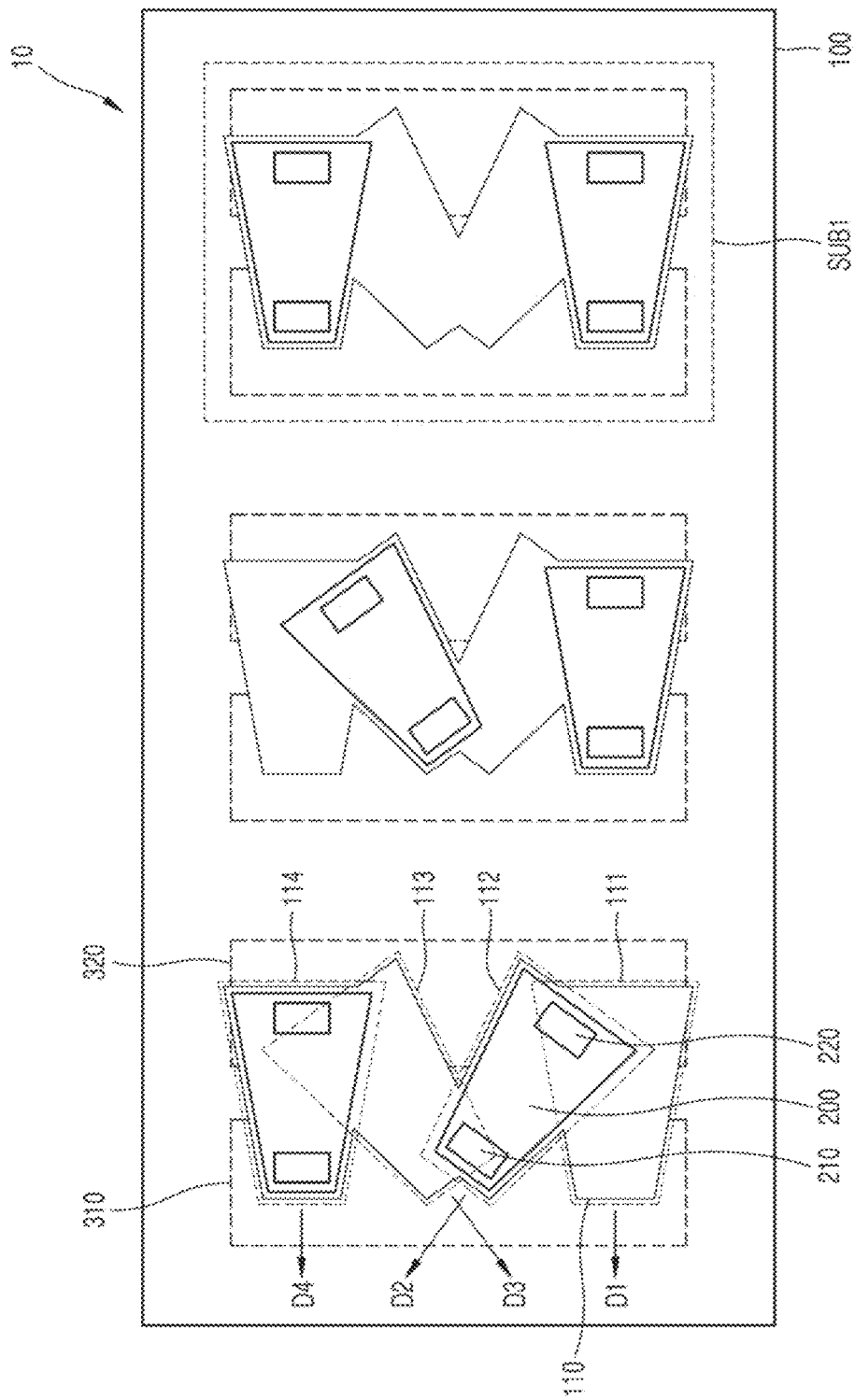
FIG. 7 is a diagram showing that the well of a display transfer structure further includes a third area and a fourth area according to an example embodiment.

FIG. 6 is a schematic diagram showing that the wells 110 and 120 of the display transfer structure 10 further include third areas 113 and 123 according to an example embodiment, and FIG. 7 is a diagram showing that the wells 110 and 120 of the display transfer structure 10 further include third areas 113 and 123 and fourth areas 114 and 124 according to an example embodiment.

Referring to FIGS. 6 and 7, the well 110 or 120 may further include third area 113 or 123, and the light emitting element 200 may be disposed in the third area 113 or 123. During the transfer process, the light emitting element 200 may be oriented in the third direction D3 and inserted into the third area 113 or 123. The third direction D3 may be the same as or different from the first direction D1, and may be the same as or different from the second direction D2. A point where the first electrode 210 of the light emitting element 200 disposed in the third area 113 or 123 is located may be included in an area that may be electrically connected to the first electrode pad 310, and a point where the second electrode 220 is located may be included in an area that may be electrically connected by the second electrode pad 320. Only the light emitting element 200 oriented in one of the first to third directions D1, D2, and D3 may be inserted into the first well 110 further including the third area 113. The second area 112 or 122 and the third area 113 or 123 may partially overlap, and the first area 111 or 121 and the third area 113 or 123 may or may not partially overlap. When the first area 111 or 121 and the third area 113 or 123 do not partially overlap each other, the two light emitting devices 200 may be disposed in the first area 111 or 121 and the third area 113 or 123 of the wells 110 or 120, respectively. However, even when only one light emitting element 200 is disposed in one of the first to third areas 111, 112, 113, 121, 122 or 123 of the sub-pixel SUB1, the corresponding sub-pixel SUB1 may be operated.

At least one light emitting element 200 may be disposed in one of the wells 110 and 120. For example, one or two light emitting elements 200 may be disposed in the first to third areas 111, 112, and/or 113 of the first well 110. When the light emitting element 200 is disposed in the second area 112, since the light emitting element cannot be disposed in the first area 111 or third area or 113, only one light emitting element may be inserted into the first well 100. When the light emitting element 200 is disposed in the first area 111, since the light emitting element 200 may or may not be disposed in the third area 113, one or two light emitting elements 200 may be disposed in the first well 110. When the light emitting element 200 is disposed in the third area 113, since the light emitting element 200 may or may not be disposed in the first area 113, one or two light emitting elements 200 may be disposed in the first well 110.

The fourth area 114 of FIG. 7 may also be included in the well 110 in the same manner as the third area 113. In this case, the fourth area 114 may partially overlap the third area 113.

Figure 8:
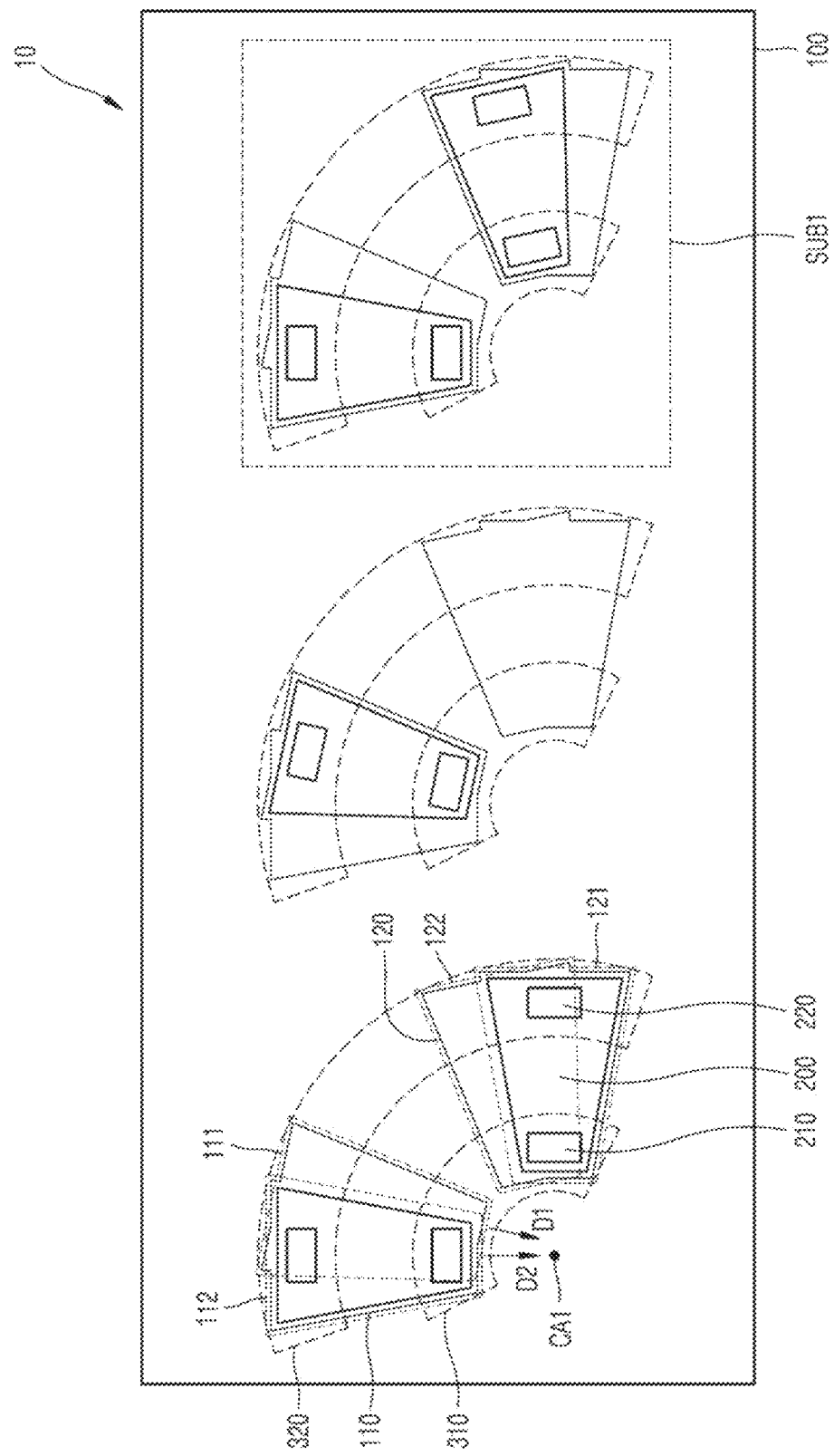
FIG. 8 is a schematic diagram showing shapes of wells and electrode pads of a display transfer structure according to an example embodiment.
Figure 9:
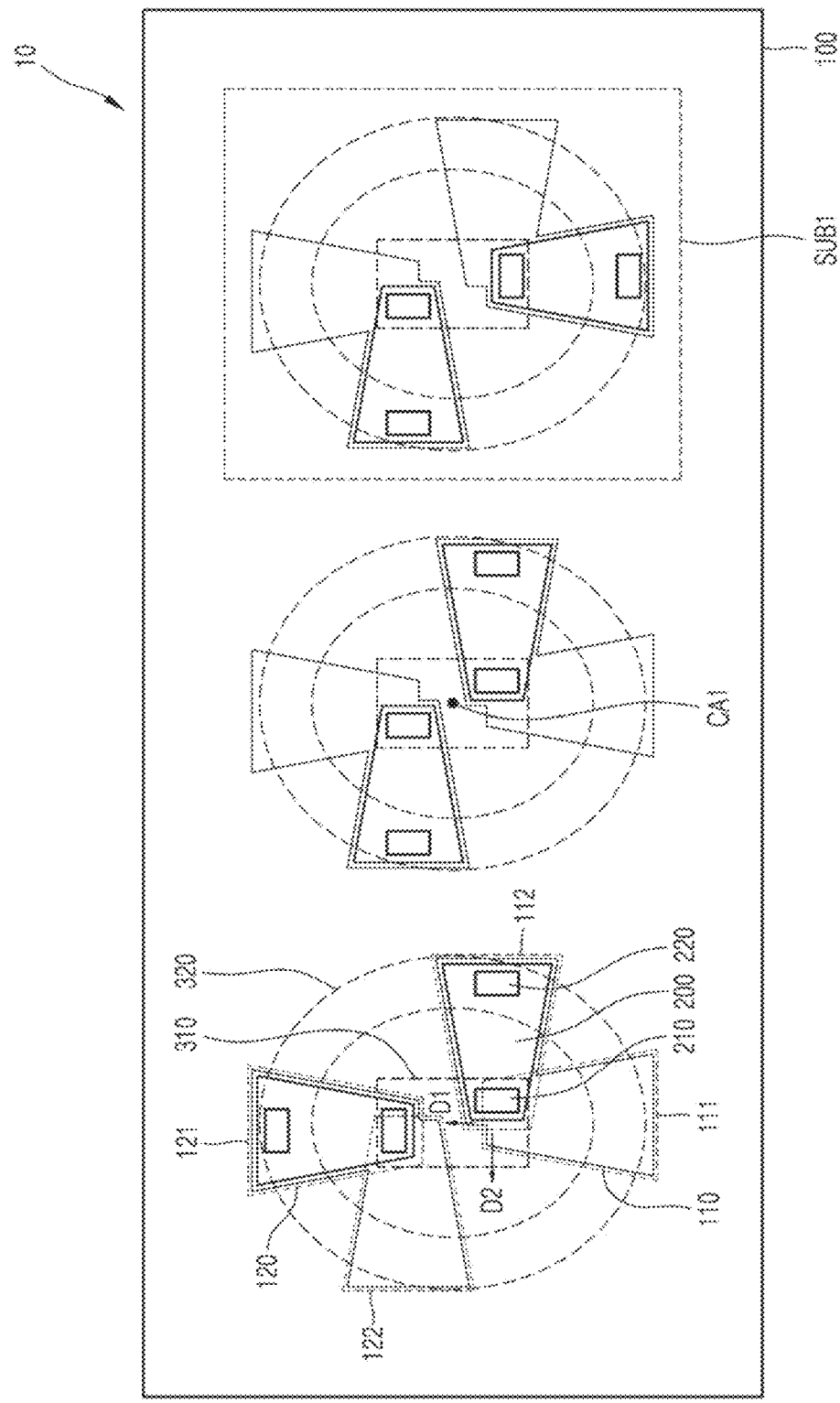
FIG. 9 is a schematic diagram showing shapes of wells and electrode pads of a display transfer structure according to an example embodiment.

FIG. 8 is a schematic diagram showing the shapes of the wells 110 and 120 and the electrode pads 310 and 320 of the display transfer structure 10 according to an example embodiment, and FIG. 9 is a diagram showing the shapes of the wells 110 and 120 and the electrode pads 310 and 320 of the display transfer structure 10 according to another example embodiment.

Referring to FIGS. 8 and 9, the first electrode pad 310 may be disposed on the substrate 100 in an arc shape, and the second electrode pad 320 may also be disposed on the substrate 100 in an arc shape. The circle formed by the arc of the first electrode pad 310 may be included in the circle formed by the arc of the second electrode pad 320, and the two circles may have a concentric relationship. The first well 110 and the second well 120 may be arranged in an arc shape based on an arbitrary central axis CA1 perpendicular to the substrate 100. The first well 110 and the second well 120 may be rotationally symmetrical. The arbitrary central axis CA1 and the center of the concentric circle may be the same or close to each other. When the distance between the first electrode pad 310 and the second electrode pad 320 is equal to or smaller than the maximum distance of the first well 110, the light emitting element 200 inserted into the first well 110 or the second well 120 may be electrically connected to the driving substrate 100. As shown in FIG. 9, the arc-shaped first and second electrode pads 310 and 320 may extend 360 degrees to have a ring shape. In this case, the first electrode pad 310 closer to the center may have a circle, ellipse, or polygon shape including the center. In the arrangement according to the above example embodiment, the central axis CA1 of the first well 110 and the central axis of the second well 120 may be the same, or the circle made by the arc of the first electrode pad 310 and the circle made by the arc of the second electrode pad 320 may be concentric circles, or the central axis CA1 of the first well 110 and the center of the concentric circle may be the same, but embodiments are not limited thereto, and the arrangement may be provided with a slight difference.

As shown in FIGS. 8 and 9, when the first well 110 and the second well 120 are not arranged in parallel, the first direction D1 of the first well 110 may be different from the first direction of the second well 120. When the second well 120 is rotated by a predetermined angle compared to the first well 110, the first direction of the second well 120 may also be rotated by the predetermined angle compared to the first direction D1 of the first well 110.

As in the example embodiment described above, the first well 110 includes a first area 111 and a second area 112, and the light emitting element 200 may be disposed in the first area 111 or the second area 112, that is, one of the two areas 111 or 112. However, embodiments are not limited thereto. For example, in addition to being arranged to fit one of the two areas 111 or 112, the light emitting element 200 may be arranged along a part of the first area 111 and a part of the second area 112

Figure 10:
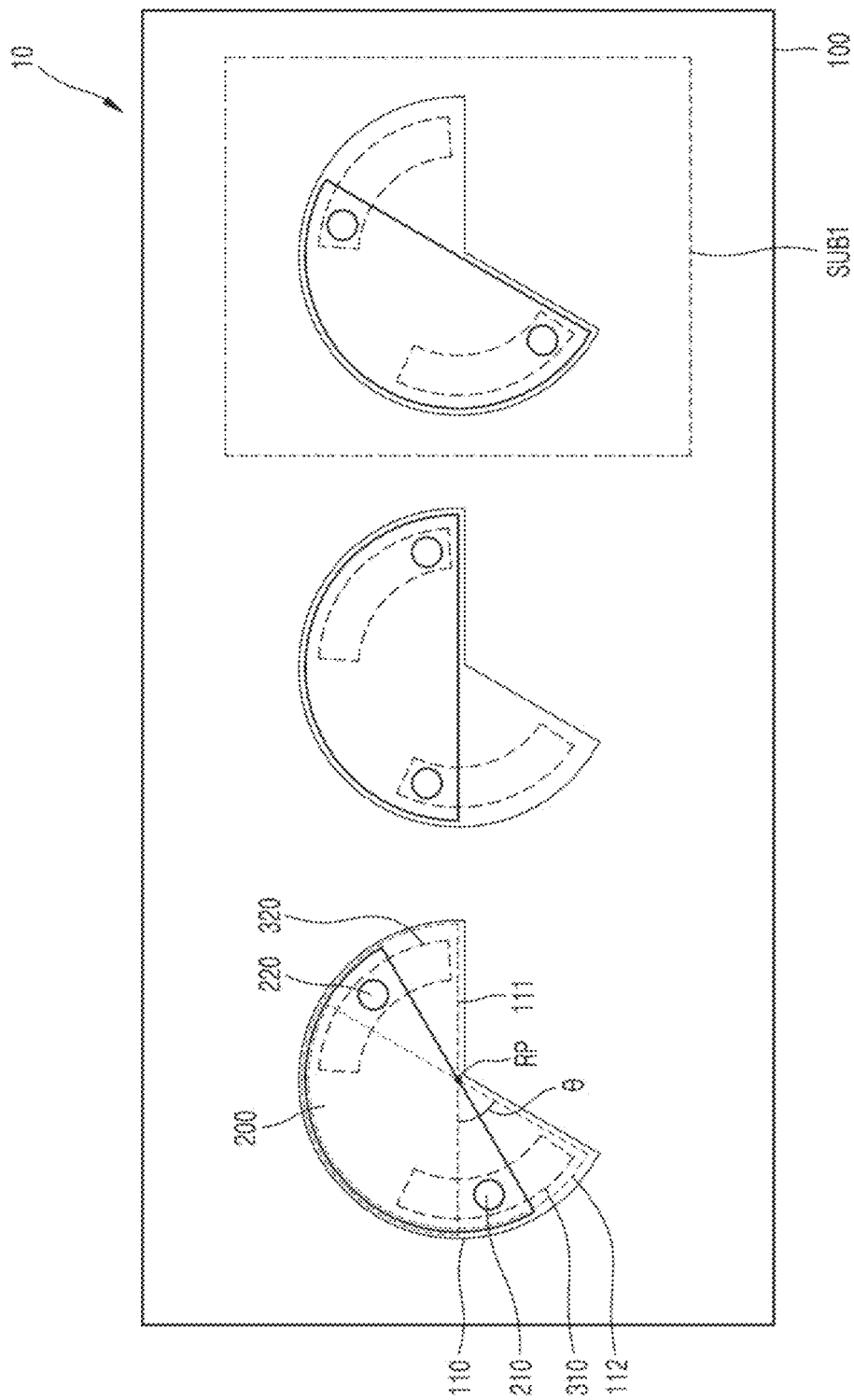
FIG. 10 shows light emitting elements and wells of a display transfer structure according to an example embodiment and shows that one of the light emitting elements is disposed on an area where the first area and the second area of the well overlap.
Figure 11:
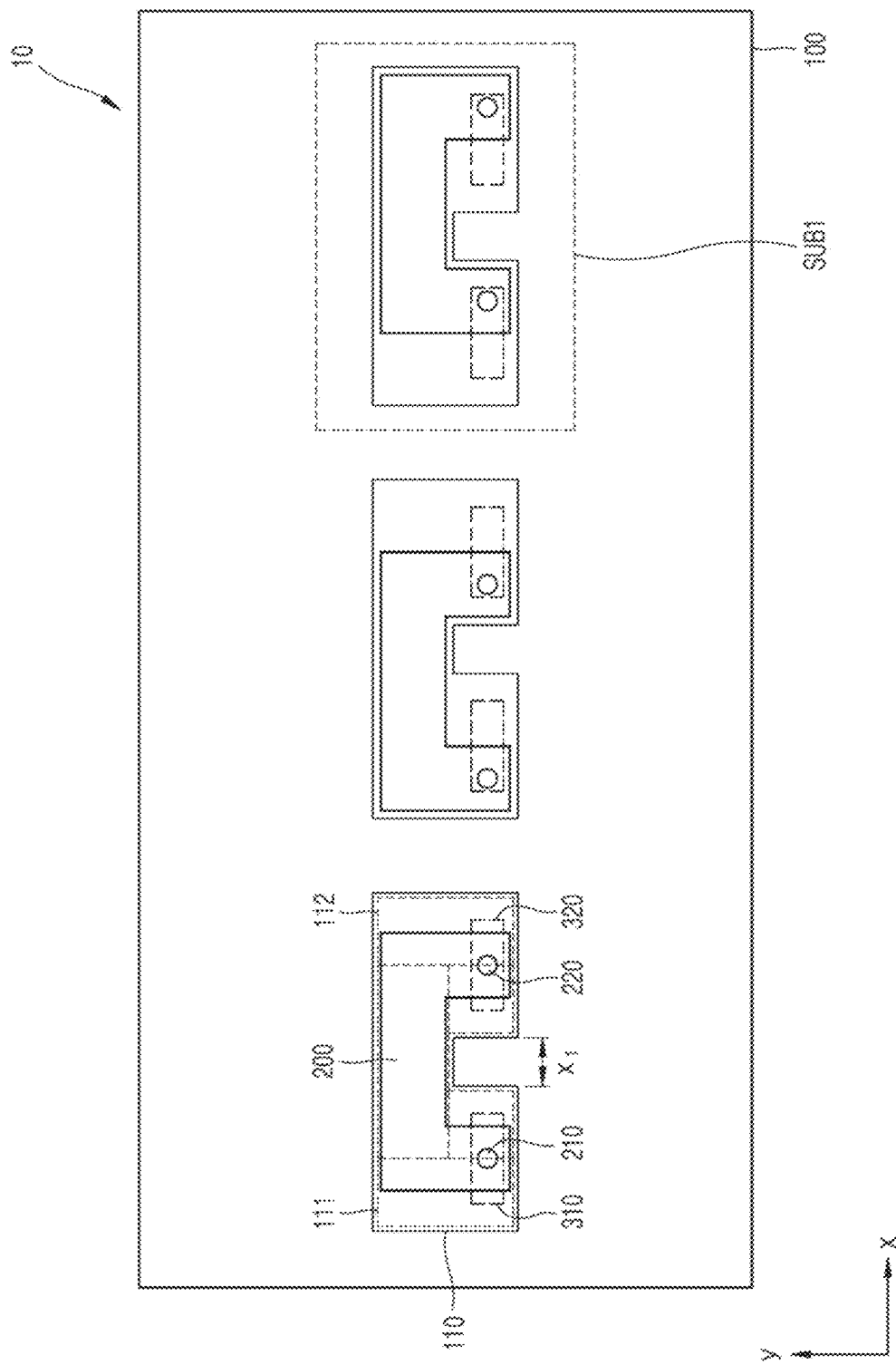
FIG. 11 shows light emitting elements and wells of a display transfer structure according to an example embodiment and shows that one of the light emitting elements is disposed on an area where the first area and the second area of the well overlap.

FIGS. 10 and 11 show the light emitting element 200 and the well 110 of the display transfer structure 10 according to example embodiments, and show that the light emitting element is disposed on an area where the first area 111 and the second area 112 of the well 110 overlap.

Referring to FIGS. 10 and 11, the first well 110 includes a first area 111 and a second area 112 partially overlapping each other, and the second area 112 may be an area where the first area 111 is rotated at a first angle κ in a counterclockwise direction with respect to a specific rotation point RP, or an area where the first area is moved in parallel by a first distance with respect to a specific direction.

Referring to FIG. 10, each of the first light emitting element 200 and the first area 111 and the second area 112 of the first well may have a semicircular shape according to an example embodiment. The specific rotation point RP may be a semicircle center of the first area 110, and the first angle θ may be approximately 60 degrees. The first light emitting element 200 may be disposed in the first area 111 or the second area 112, but may be disposed in an area where the first area 111 and the second area 112 overlap. For example, when the first light emitting element 200 is disposed in the first area 111, the first light emitting element 200 may be disposed over an exclusive area of the first area 111, corresponding to only by the first area 111 and not the second area 112, and an area where the first area 111 and the second area 112 overlap. The first light emitting element 200 disposed on the overlapping area of the first area 111 and the second area 112 may be disposed over an area where the first area 111 and the second area 112 overlap, a part of the exclusive area of the first area 111, and a part of the exclusive area of the second area 112. The first electrode 210 and the second electrode 220 of the first light emitting element 200 may be disposed to be spaced apart from each other by the longest distance on the planar shape of the first light emitting element 200 (the distance between them is approximately diameter of a semicircle), and the first electrode pad 310 disposed in the first well 110 may be disposed in an arc shape of approximately 0 degrees to 60 degrees along the planar shape of the first well 110 so as to be electrically connected to the first electrode 210 of the first light emitting element 200, and the second electrode pad 320 may be disposed in an arc shape of approximately 180 degrees to 240 degrees with respect to the first well 110 along the planar shape of the first well 110.

Referring to FIG. 10, the first area 111 may be oriented in a first direction, and for example, the angle of the first direction may be 0 degrees based on a specific rotation point RP, for example, the center of a semicircle. Since the second area 112 is an area where the first area is rotated by a first angle, that is, 60 degrees, the second area 112 may be directed in the second direction, and the angle of the second direction may be 60 degrees based on a specific rotation point. The first light emitting element 200 may be disposed in the first area 111 of the first well 110 in the first direction, or may be disposed in the second area 112 of the first well 110 in the second direction, or may be oriented in a direction rotated by a second angle with respect to the rotation point RP in the first direction to be disposed in an area where the first area and the second area 111 and 112 overlap. Here, the second angle may be any angle within the range of 0 degrees to the first angle. For example, the first light emitting element 200 may be oriented at 10 degrees, 30 degrees, or 55 degrees to be disposed in the first well 110. That is, the first light emitting element 200 may be disposed in the first well 110 in one of continuous directions of 0 degrees to 60 degrees. Since the first light emitting element 200 is disposed in the first well 110 only at an angle within the range of 0 degrees to 60 degrees, the first and second electrode pads 310 and 320 and the first and second electrodes 210 and 220 may be electrically connected to each other.

Referring to FIG. 11, the first light emitting element 200 and the first area 111 and the second area 112 according to the example embodiment may have a planar shape in which a portion is removed from a rectangle. The first direction may be an x-axis direction, and the first distance may be an x-axis length $x_1$ of the first portion. The first direction of the first area 111 of the first well 110 and the second direction of the second area 112 may be same.

The first light emitting element 200 may be disposed in the first area 111 or the second area 112, but may be disposed in an area where the other first area 111 and the second area 112 overlap. For example, when the first light emitting element 200 is disposed in the first area 111, the first light emitting element 200 may be disposed over an exclusive area of the first area 111 and an area where the first area 111 and the second area 112 overlap. The first light emitting element 200 disposed on the overlapping area of the first area 111 and the second area 112 may be disposed over an area where the first area 111 and the second area 112 overlap, a part of the exclusive area of the first area 111, and a part of the exclusive area of the second area 112. The first and second electrodes 210 and 220 of the first light emitting element 200 may be disposed to be spaced apart from each other by a distance on the planar shape of the first light emitting element 200 (the distance between them is the length of the long side of the rectangle), and the first electrode pad 310 disposed in the first well 110 may be disposed on the left side with respect to a portion of the first well 110 to be electrically connected to the first electrode 210 of the first light emitting element 200, or the second electrode pad 320 may be disposed on the right side with respect to a portion of the first well 110.

Referring to FIG. 11, the first area 111 and the second area 112 may be oriented in the same first direction. The first light emitting element 200 may be disposed in the first area 111 of the first well 110 in the first direction, or may be disposed in the second area 112 of the first well 110 in the first direction, or, may be oriented in the first direction to be disposed on an area where the first area and the second area 111 and 112 overlap at a position moved in parallel by a second length with respect to the specific direction in the first direction. Here, the second length may be any length within 0 to $x_1$. Since the first light emitting element 200 is not disposed in the first well 110 in a direction other than the first direction, the first and second electrode pads 310 and 320 and the first and second electrodes 210 and 220 may be electrically connected to each other.

The rotational asymmetry planar shape, the first angle θ value, and the first length value of the first light emitting element 200 and the first well 110 according to the above example embodiment are merely examples. The first and second electrode pads 310 and 320 and the first and second electrodes 210 and 220 may be electrically connected to each other, and the light emitting element may be placed only within the expected directional range. When the plane of the light emitting element 200 is a rotationally asymmetric shape, any other planar shapes, angle values, or length values are possible.

Figure 12:
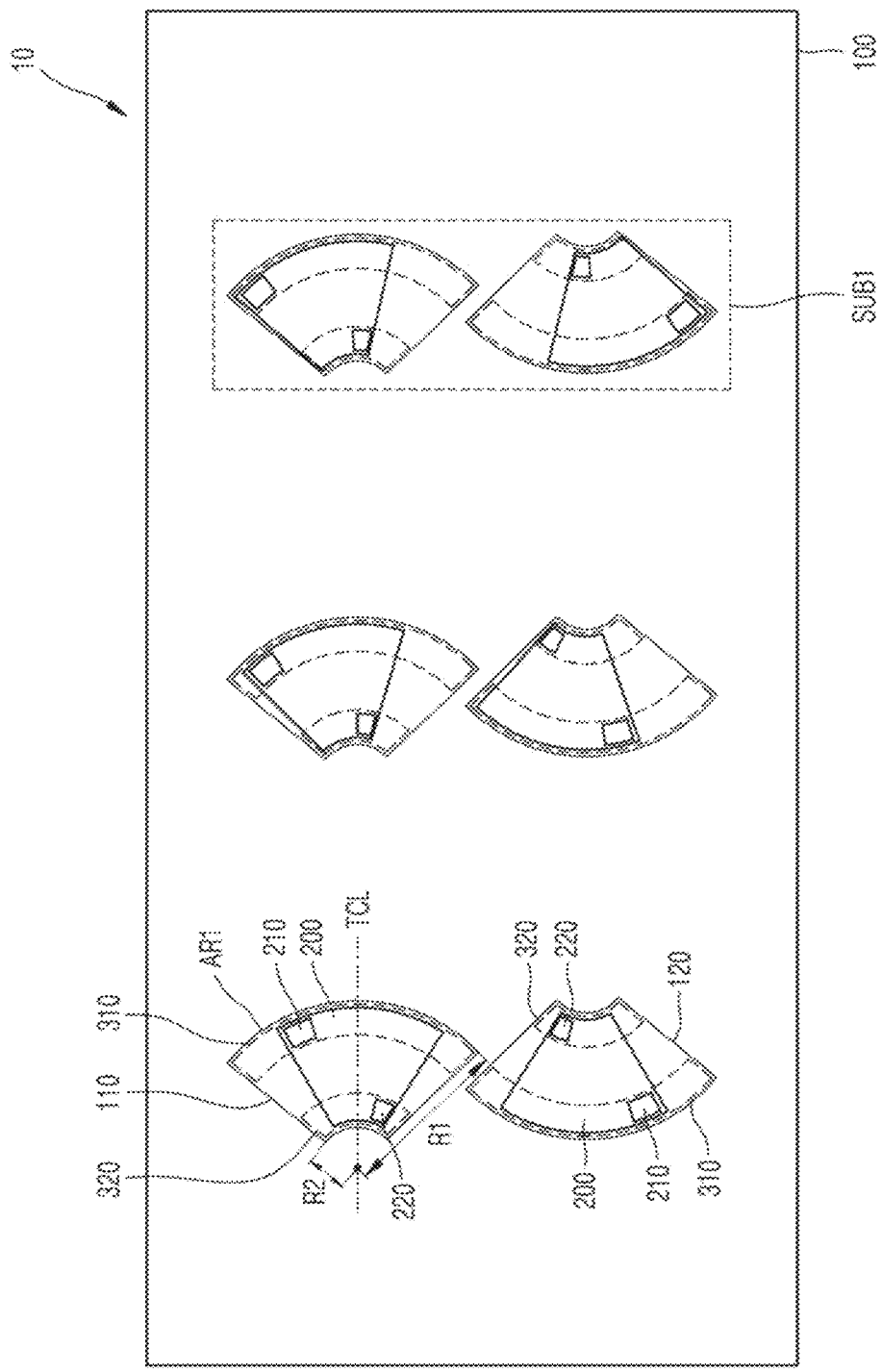
FIG. 12 is a diagram illustrating light emitting elements and wells of a display transfer structure having a tapered planar shape according to an example embodiment.
Figure 13:
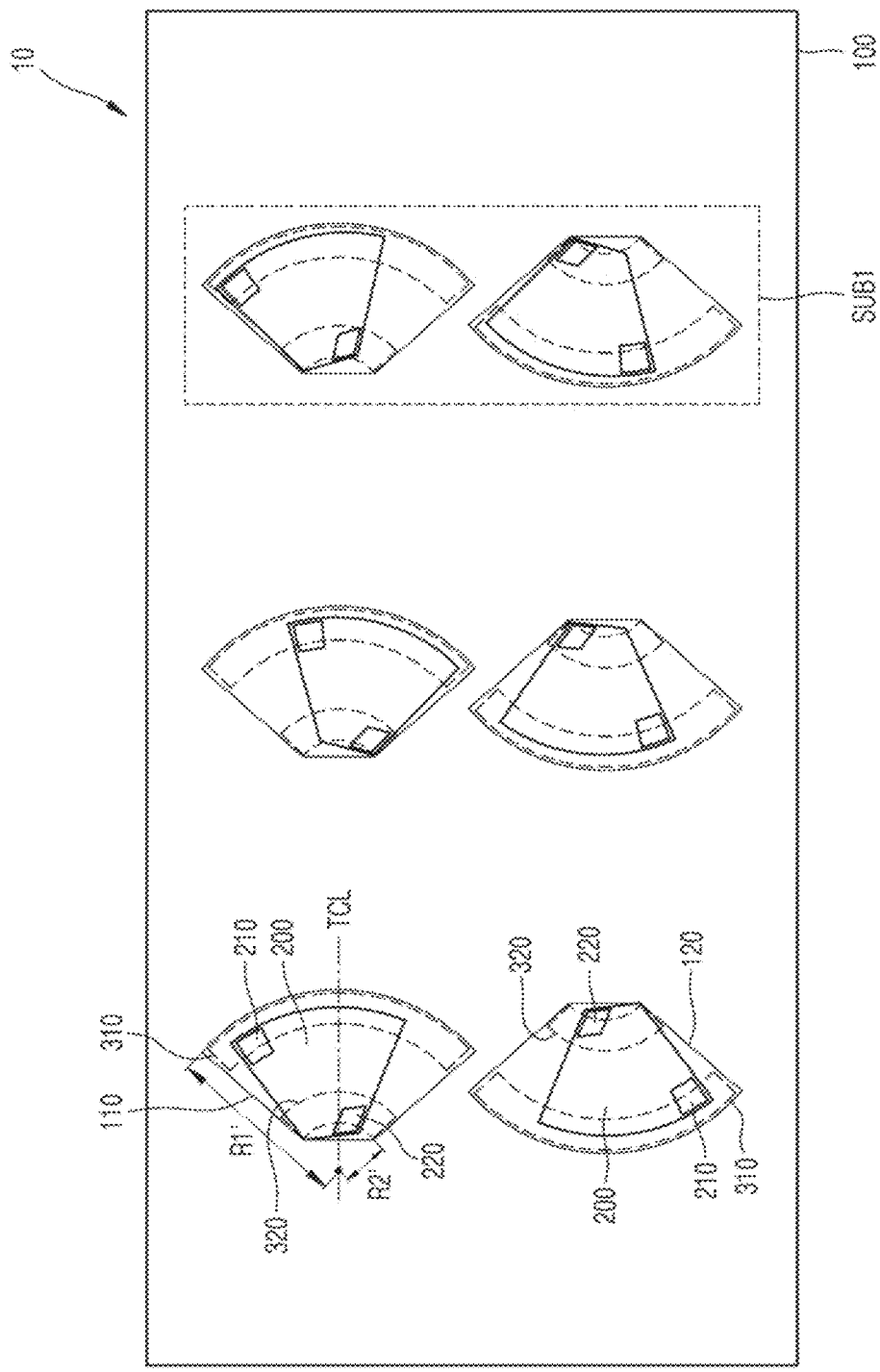
FIG. 13 is a diagram illustrating light emitting elements and wells of a display transfer structure having a tapered planar shape according to an example embodiment.
Figure 14:
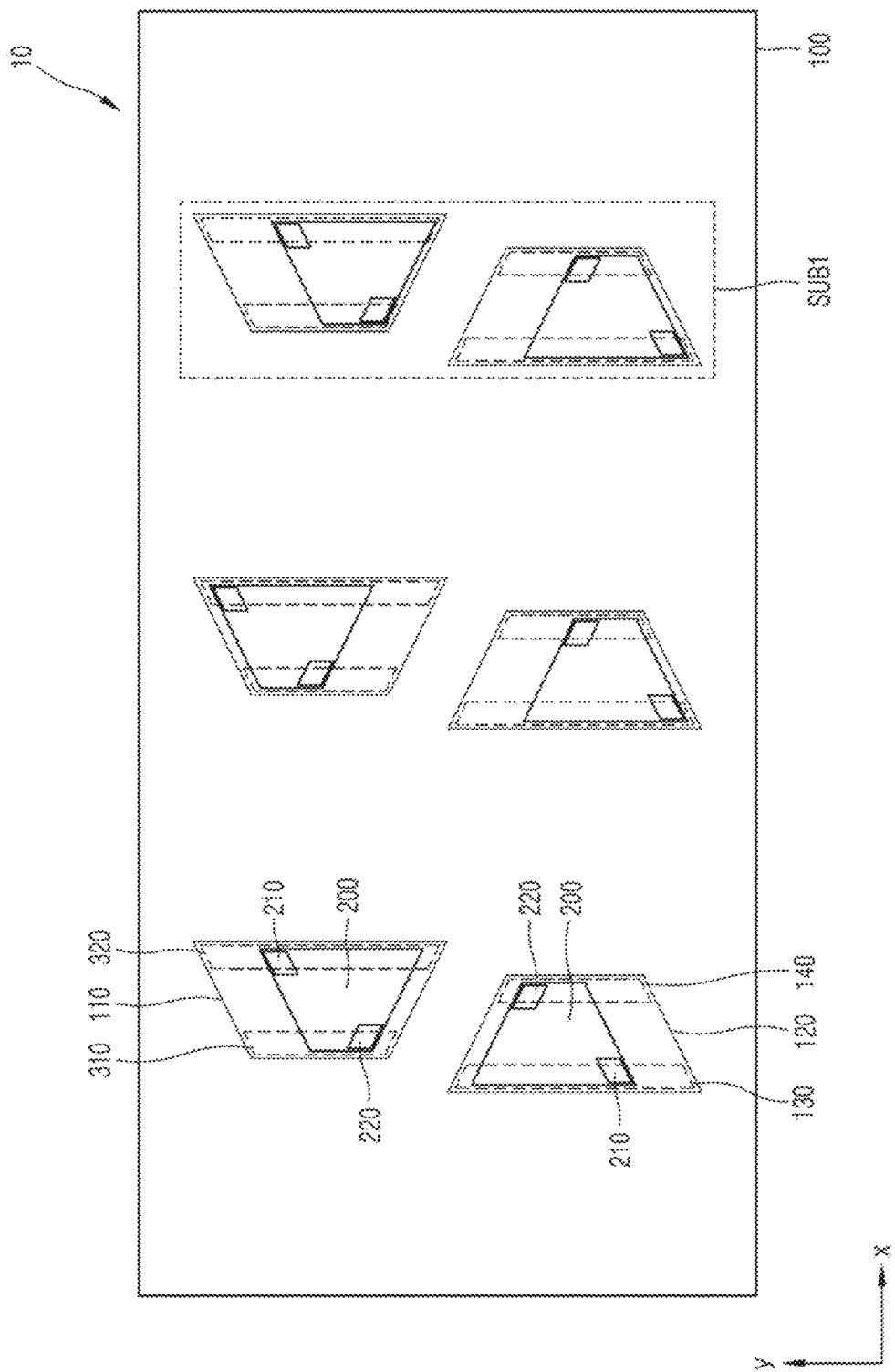
FIG. 14 is a diagram illustrating a light emitting elements and wells of a display transfer structure having a tapered planar shape according to an example embodiment.

FIGS. 12 to 14 are diagrams illustrating the light emitting element 200 and the wells 110 and 120 of the display transfer structure 10 according to an example embodiment each have a tapered planar shape.

Referring to FIGS. 12 to 14, the light emitting element 200 of the display transfer structure 10 according to an example embodiment may have a tapered planar shape, and the wells 110 and 120 may have a tapered planar shape equal to or greater than the planar shape of the light emitting element 200. At this time, the smaller surface among the surfaces intersecting the taper centerline TCL of the light emitting element 200 may be disposed facing the smaller side of the sides that intersect the taper centerline of the wells 110 or 120, and the larger surface among the surfaces that intersect the taper centerline TCL of the light emitting element 200 may be disposed facing the larger side of the sides that intersect the taper centerline of the wells 100 or 120. When one inclined surface of the light emitting element 200 is disposed in contact with one inclined surface of the planar shape of the first well 110, the light emitting element 200 may be oriented in a first direction. When another inclined surface of the light emitting element 200 is disposed in contact with another inclined surface of the planar shape of the first well 110, the light emitting element 200 may be oriented in the second direction. Referring to the example embodiment of FIG. 10 above, in relation to the first well 110 of FIG. 12, a planar portion of the first well 110 overlapping the light emitting element 200 may be referred to as a first area when the light emitting element 200 is disposed in contact with one inclined surface of the first well 110. In addition, when the light emitting element 200 is disposed in contact with the other inclined surface of the first well 110, a planar portion of the first well 110 overlapping the light emitting element 200 may be referred to as a second area. In addition, the specific rotation point may be referred to as a center of a circle formed by extending a sector-shaped arc, and an angle between the first area and the second area with respect to the rotation point may be referred to as a first angle. When both inclined surfaces of the light emitting element 200 are disposed without being in contact with the two inclined surfaces of the first well 110 planar shape, the light emitting element 200 may be oriented in one direction between the first direction and the second direction. Each of the first direction and the second direction may be a direction having a discrete angle. For example, the first direction may be a reference angle and may be 0 degrees with respect to an arbitrary point, and the second direction may be a direction rotated by 60 degrees from the first direction with respect to a point. The one direction between the first direction and the second direction may be any one direction within a continuous angular range. For example, when the first direction is 0 degrees and the second direction is 60 degrees, the direction between may be 1 degree, 30 degrees, or 59.5 degrees. As shown in FIGS. 12 to 14, when the light emitting element 200 has a tapered planar shape and the first well 110 has a tapered planar shape having taper per inch TPI equal to or greater than the planar shape of the light emitting element 200, the light emitting element 200 may be oriented in a direction therebetween, including a first direction and a second direction. However, as the angle increases, the light emitting element 200 may be inserted in an undesired direction, so it may be preferable that the angle between the first direction and the second direction be 180 degrees or less. When the wells 110 and 120 include an area where the light emitting element 200 may be arranged in various directions, the transfer efficiency of the light emitting element 200 may be increased.

TPI may represent the degree of inclination of the inclined surface, and may be expressed by the following equation.

$$TPI = \frac{A-B}{L} \qquad \text{[Equation 1]}$$

Here, TPI is taper per inch representing the proportions for taper, A is the length of the longest line segment among the large diameter length or intersecting the taper centerline, B is the small diameter length or the length of the smaller line segment intersecting the taper centerline, and L is the length of the taper or the length between the intersections between the taper centerline and the intersecting line segment.

Referring to FIG. 12, the light emitting element 200 and the wells 110 and 120 may have a truncated sectoral shape. The cut sector shape may be a shape by removing the sector having a radius of R2 smaller than R1 from the sector having a radius of R1. For example, based on one point, the first direction may be 0 degrees and the second direction may be 30 degrees. The one point may denote an intersection point of the extended lines of inclined surfaces of the sector. The light emitting element 200 may be inserted into the first well 110 oriented in a direction having an angle between 0 degrees and 30 degrees. However, 30 degrees is not limited thereto as an example, and various angles may be possible. An angle of 180 degrees or less may be desirable to prevent insertion of the light emitting element 200 in an unintended direction. The first electrode 210 of the light emitting element 200 may be disposed at one vertex close to a sector arc (hereinafter, AR1) of the length R1, and the second electrode 220 may be disposed at a vertex farther from the first electrode 210 among vertices close to the sector arc (hereinafter, AR2) of the length R2. However, embodiments are not limited thereto, and the first electrode 210 may be disposed near AR1, and the second electrode 220 may be disposed near AR2, so that it may at least have an interval equal to or greater than the interval obtained by subtracting R1 from R2. The first electrode pad 310 may be disposed in the first well 110 in an arc shape along AR1. The second electrode pad 320 may also be spaced apart from the first electrode pad 310 and disposed in the first well 110 in an arc shape along AR2.

A surface having a larger size among surfaces intersecting the taper centerline TCL of the light emitting element 200 and a surface having a larger size among surfaces intersecting the taper centerline of the first well 110 may be disposed to face each other. In this case, the first electrode 210 and the first electrode pad 310 may be electrically connected to each other. In such a manner, a surface having a smaller size among surfaces intersecting the taper centerline TCL of the light emitting element 200 and a surface having a smaller size among surfaces intersecting the taper centerline of the first well 110 may be disposed to face each other. In this case, the second electrode 220 and the second electrode pad 320 may be electrically connected to each other.

The light emitting element 200 of the display transfer structure 10 according to the example embodiment of FIG. 12 has a cut sector shape that is a tapered planar shape, but embodiments are not limited thereto, and the light emitting element 200 may be inserted into the first well 110 only in a direction therebetween, including the first direction and the second direction, and the first electrode 210 may be connected to the first electrode pad 310 and the second electrode 220 may be connected to the second electrode pad 320, and when the light emitting element 200 is a rotationally asymmetric shape, any other shape may be possible.

Referring to FIG. 13, the light emitting element 200 and the wells 110 and 120 of the display transfer structure 10 according to an example embodiment may have a cut sector shape. Here, the cut sector shape may be a shape in which an isosceles triangle having two sides of length R2' smaller than R1' in a sector having a radius R1', and having a vertex between the two sides that are the center of the sector is removed. For example, the first well 110 may be inserted in a direction in which the light emitting element 200 is oriented at an angle between 0 degrees and 30 degrees. The first electrode 210 of the light emitting element 200 may be disposed at one vertex portion close to the R1' sector arc, and the second electrode 220 may be disposed at a vertex farther from the first electrode 210 among vertices close to the base of the R2' isosceles triangle. The cut sector shape of FIG. 13 may reduce chip breakage than the cut sector shape of FIG. 12 and the transfer probability may be increased.

Referring to FIGS. 12 and 13, a first well 110 and a second well 120 may be disposed in a subpixel. For example, when the first direction of the first well is 0 degrees and the second direction is 30 degrees, based on the first direction of the first well, the first direction of the second well 120 may be 180 degrees and the second direction may be 210 degrees. In this case, the electrode pads arrangement direction of the first well 110 may be opposite to the electrode pads arrangement direction of the second well 120. By including the first well 110 as well as the second well 120 in the subpixel, since the light emitting element 200 may be transferred to the subpixel in more various directions, transfer efficiency may be increased.

Referring to FIG. 14, the light emitting element 200 and the wells 110 and 120 may have a trapezoidal shape. The first direction and the second direction may be the same direction. Referring to the example embodiment of FIG. 11 above, in relation to the first well 110 of FIG. 14, when the light emitting element 200 is disposed in contact with one inclined surface of the first well 110, a planar portion of the first well 110 overlapping the light emitting element 200 may be referred to as a first area, and when the light emitting element 200 is placed in contact with the other inclined surface of the first well 110, a plane of the first well 110 overlapping the light emitting element 200 may be referred to as a second area. In this case, the first direction may indicate a Y-axis direction, and a distance between the center of the first area and the center of the second area may be referred to as a first length. The planar shape of the first well 110 may have an aspect ratio different from the planar shape of the light emitting element 200. The light emitting element 200 oriented in the first direction may be inserted into the first well 110. For example, when the upper side of a trapezoid is shorter than the lower side, the upper side of the planar shape of the first well 110 may have a shorter length than the lower side of the planar shape of the light emitting element 200. For example, the planar shape of the light emitting element 200 and the first well 110 may be a trapezoid with different aspect ratios, and the planar shape of the light emitting element 200 may have an upper side: bottom side=1:3, and the planar shape of the first well 110 may have an upper side:bottom side=1:2. The first electrode 210 may be disposed at one vertex of the lower side of the planar shape of the light emitting element 200, and may be disposed at a vertex farther from the first electrode 210 among two vertices of the upper side. However, embodiments are not limited thereto, and the first electrode 210 may be disposed near the lower side, and the second electrode 220 may be disposed near the upper side, so that an electrode interval may be greater than or equal to the height of the trapezoid. The first electrode pad 310 may be disposed in the first well 110 in a linear shape along the lower side of the planar shape of the first well 110. The second electrode pad 320 may also be spaced apart from the first electrode pad 310 and disposed in the first well 110 in a straight line along the upper side of the planar shape of the first well 110.

Referring to FIG. 14, a first well 110 and a second well 120 may be disposed in a subpixel. The second well 120 may have a shape in which the first well 110 is rotated by 180 degrees. In this case, the electrode pad arrangement direction (first direction) of the first well 110 and the electrode pad arrangement direction (second direction) of the second well 120 may be 180 degrees rotationally symmetrical. By including the first well 110 as well as the second well 120 in the subpixel, since the light emitting element 200 may be transferred to the subpixel in a plurality of directions (a first direction or a second direction), transfer efficiency may be increased.

The light emitting element 200 of the display transfer structure according to the example embodiment according to the embodiment of FIG. 14 has a trapezoidal shape in a tapered plane, but is not limited thereto, and the light emitting element 200 may be inserted into the first well 110 only when oriented in the first direction, and the first electrode 210 may be connected to the first electrode pad 310 and the second electrode 220 may be connected to the second electrode pad 320, and when the light emitting element 200 has a rotationally asymmetric planar shape, any other shape may be possible.

Figure 15:
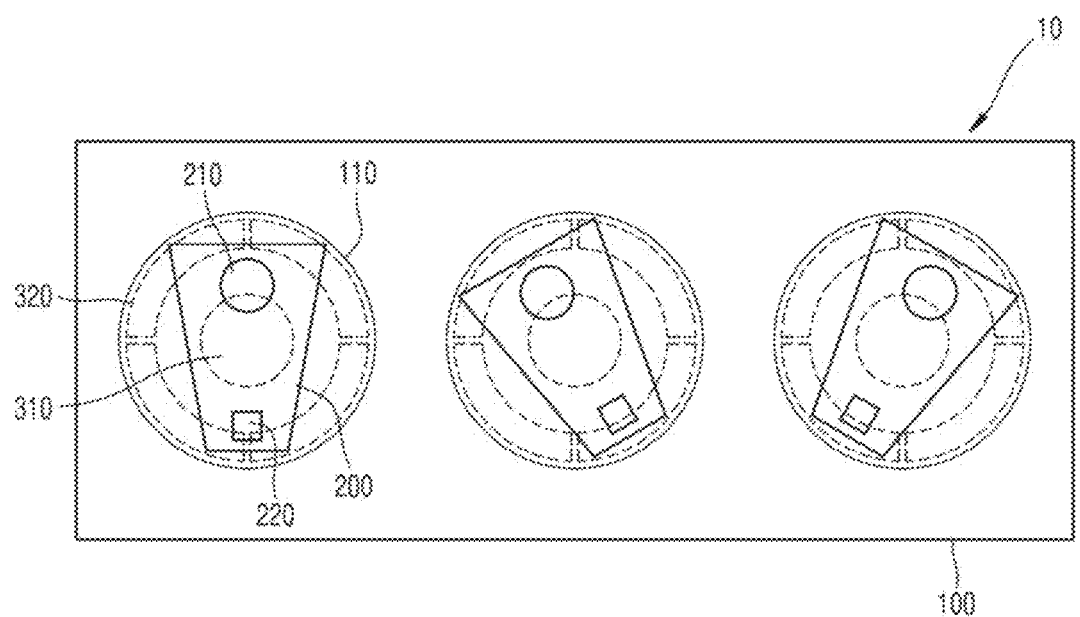
FIG. 15 is a diagram illustrating a first well of a display transfer structure having a circular shape and a light emitting element having a trapezoidal shape according to an example embodiment.

FIG. 15 is a diagram illustrating that the first well 110 has a circular shape and the light emitting element 200 has a trapezoidal shape.

Referring to FIG. 15, the first well 110 has a circular plane, and the diameter of the circle is greater than the longest length of the disposed light emitting element 200. The disposed light emitting element 200 may be oriented in any direction. Even when the light emitting element 200 is inserted in an arbitrary direction, the first electrode 210 and the second electrode 220 of the light emitting element 200 may be electrically connected to the first electrode pad 310 and the second electrode pad 320, respectively. The first electrode 210 of the light emitting element 200 may be disposed to be spaced apart from the lower side of the planar shape by a predetermined distance, and the second electrode 220 may be disposed near the upper side of the planar shape. The first electrode pad 310 may be disposed in various shapes such as a circle, an ellipse, and a polygon at the center of the first well 110. In this case, a circular shape may be preferable. The second electrode pad 320 may be arranged in a ring shape or a plurality of arc shapes spaced apart along the edge of the first well 110.

A distance between the first electrode 210 and the second electrode 220 disposed to be spaced apart in the light emitting element 200 may be greater than a distance between the center of the first well 110 and the second electrode 220. A predetermined distance at which the first electrode 210 is spaced apart from the lower side may be equal to or greater than the minimum distance that prevents the first electrode 210 of the light emitting element 200 from being connected to the second electrode pad 320 in the first well 110. The predetermined distance may be the minimum distance. In the case of the light emitting element 200 without rotational symmetry as described above, since it is possible to secure an electrode interval between the first electrode 210 and the second electrode 220, the possibility of occurrence of defects due to alignment error may be reduced and the light emitting area may be widened.

In the example embodiment according to FIG. 15, the light emitting element 200 has a trapezoidal shape, but is not limited thereto, and the first electrode 210 may be connected only to the first electrode pad 310, and the second electrode 220 may be connected only to the second electrode pad 320, and when the light emitting element 200 has a rotationally asymmetric planar shape, any other shape may be possible.

Figure 16A:
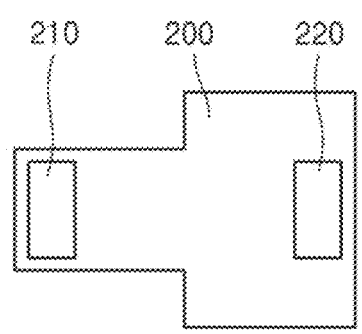
FIGS. 16A, 16B, and 16C are diagrams each illustrating a light emitting element having various shape without rotational asymmetry other than a trapezoidal shape of a display transfer structure according to an example embodiment.
Figure 16B:
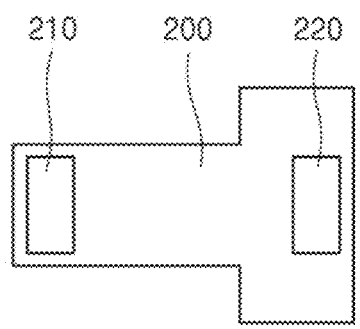
Figure 16C:
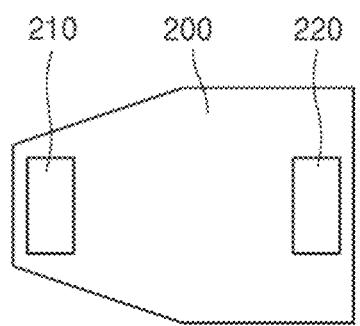
Figure 17A:
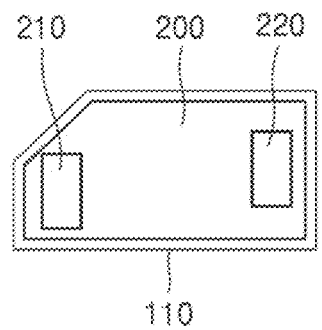
FIGS. 17A, 17B, 17C and 17D are diagrams each illustrating a light emitting element having a shape with rotational asymmetry and line asymmetry of a display transfer structure according to an example embodiment.
Figure 17B:
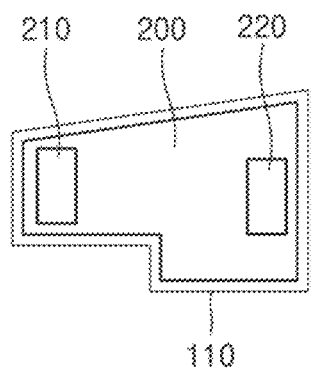
Figure 17C:
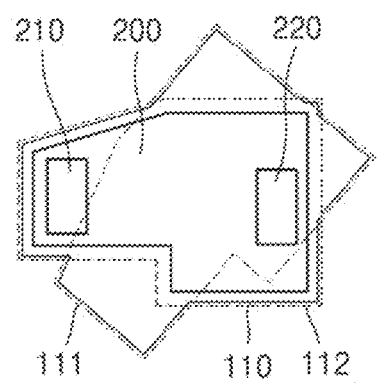
Figure 17D:
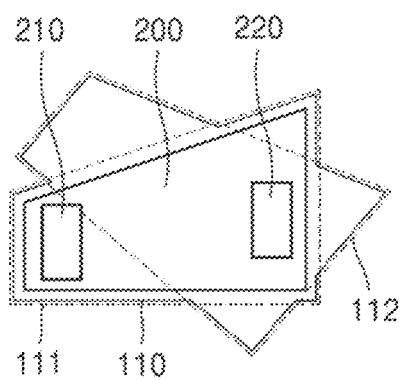

FIGS. 16A to 16C are schematics showing a light emitting element 200 having a shape with various rotational asymmetry other than a trapezoidal shape, and FIGS. 17A to 17D are schematic diagrams illustrating a light emitting element 200 having a shape with rotational asymmetry and line asymmetry.

Referring to FIGS. 16A to 16C, the light emitting element 200 of the display transfer structure 10 according to an example embodiment may have a polygonal shape. The polygonal light emitting element 200 may have a body portion and a protrusion portion. The first electrode 210 may be disposed on the body portion, and the second electrode 220 may be disposed on the protrusion portion. In the case of the light emitting element 200 of the example embodiment of FIGS. 16A to 16C, insertion may be advantageous when the substrate 100 has the first well 110 having a circular shape. However, embodiments are not limited thereto, and may be used when the first well 110 includes a first direction and a second direction that partially overlap.

Referring to FIGS. 17A to 17D, the light emitting element 200 of the display transfer structure 10 according to an example embodiment may have a planar shape with rotational asymmetry and line asymmetry. In the transfer process, when the light emitting element 200 has a shape with line asymmetry such as the light emitting element 200 of the example embodiment of FIGS. 17A to 17D, the light emitting element 200 may be inserted into the first well 110 having the same shape as the light emitting element 200 without being turned upside down. According to another example, since the light emitting element 200 may be inserted into the first well 110 including the first area 111 and the second area 112 having the shape of the light emitting element 200 without being turned over, this may be advantageous during the transfer process.

Figure 18:
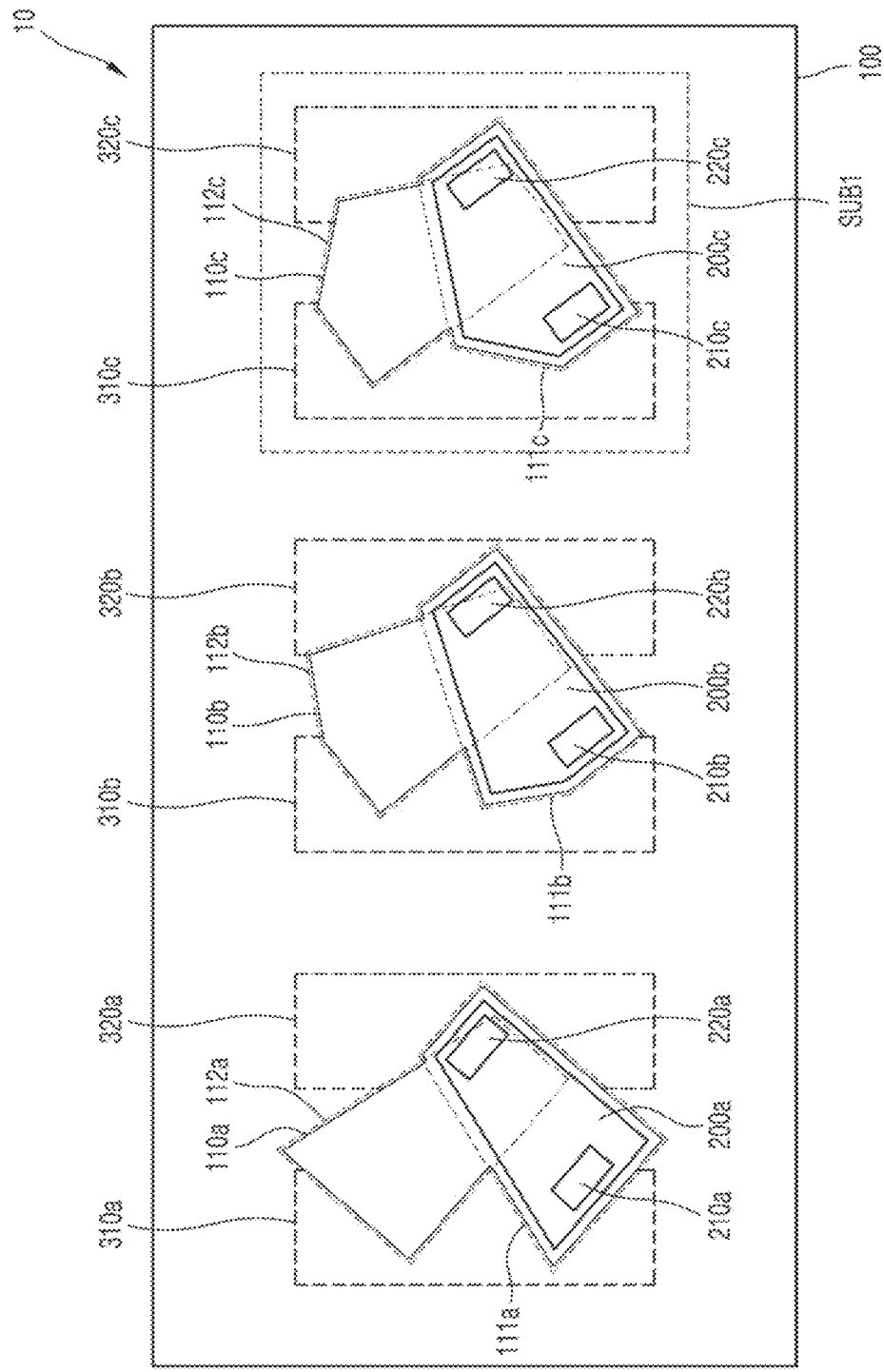
FIG. 18 is a diagram illustrating light emitting elements having different shapes respectively inserted into a plurality of wells having different shapes of a display transfer structure according to an example embodiment.

FIG. 18 is a diagram illustrating that light emitting elements having different shapes are inserted into the plurality of wells 110a, 110b, and 110c having different shapes.

The plurality of wells 110a, 110b, and 110c may include a third well 110a, a fourth well 110b, and a fifth well 110c having different shapes. The plurality of wells 110a, 110b, and 110c may include a plurality of areas. The third well 110a, the fourth well 110b, and the fifth well 110c may be included in different subpixels, respectively. A plurality of light emitting elements 200a, 200b, and 200c have different shapes, and may include a third light emitting element 200a disposed in the third well 110a, a fourth light emitting element 200b disposed in the fourth well 110b, and a fifth light emitting element 200c disposed in the fifth well 110c. For example, the plurality of light emitting elements 200a, 200b, and 200c may be exclusively inserted into the plurality of wells 110a, 110b, and 110c according to their shapes.

Different subpixels may emit different colors, and one pixel may include the subpixels. For example, different subpixels may implement red light (R), green light (G), and blue light (B), respectively. One pixel may implement full color.

When a plurality of light emitting elements have different shapes and are respectively inserted into corresponding wells, the red light (R) emitting element 200a, green light (G), emitting element 200b and blue light (B) light emitting element 200c may be simultaneously transferred to the substrate 100. As it is possible to quickly transfer the light emitting elements 200a, 200b, and 200c emitting different color light to the large-area display transfer structure 10, large-area transfer is possible, which may be applied to a large display device. In addition, it is possible to lower the large-area transfer cost of the micro light emitting element, thereby reducing the unit cost of the display device.

Figure 19B:
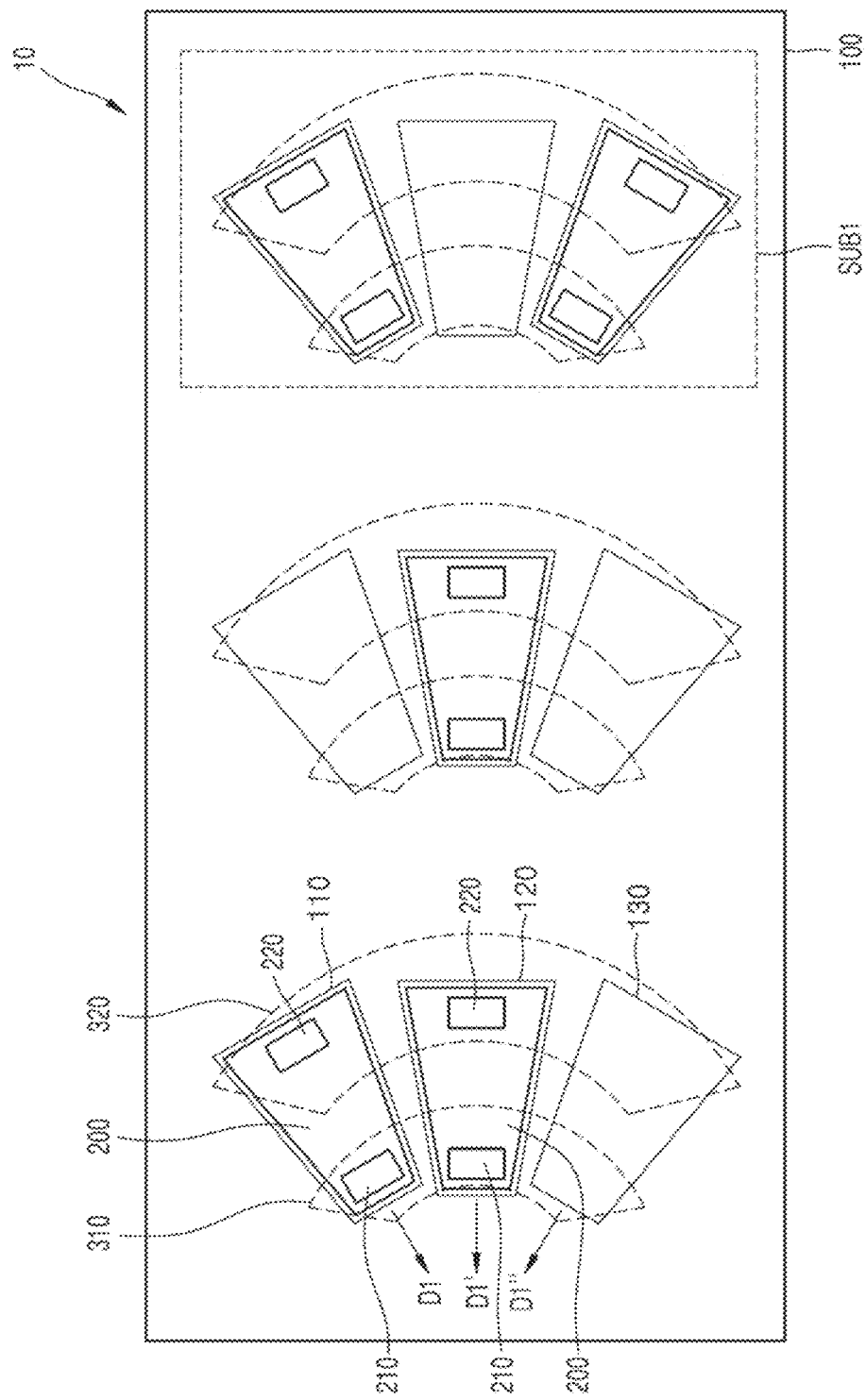
FIG. 19B is a schematic diagram showing a display transfer structure according to an example embodiment.

FIGS. 19A and 19B are schematic diagrams showing a display transfer structure 10 according to an example embodiment.

Referring to FIGS. 2, 19A and 19B, the display transfer structure 10 according to an example embodiment includes a substrate 100 including a plurality of wells 110 and 120 and a plurality of light emitting elements 200 disposed in the plurality of wells, and the light emitting element 200 has a rotationally asymmetric planar shape. Adjacent first well 110 and second well 120 are included in one subpixel SUB1, and the light emitting element 200 disposed in the first well 110 is oriented in a first direction D1 of the first well 110, and the light emitting element 200 disposed in the second well 120 may be oriented in a first direction D1' of the second well that is different from the first direction D1 of the first well 110. The light emitting element transferring method according to an example embodiment includes preparing a substrate 100 including a plurality of wells 110, 120, and 130 (S100), and supplying a plurality of light emitting elements 200 having a rotationally asymmetric planar shape on a substrate and transferring at least one of the plurality of light emitting elements 200 to one of the plurality of wells 110, 120, and 130 (S200). Adjacent first well 110 and second well 120 are included in one subpixel SUB1, and one light emitting element 200 is inserted into the first well 110 in the first direction D1, and/or another light emitting element 200 may be inserted into the second well 120 in a first direction D1' of the second well 120 that is different from the first direction D1 of the first well 110. As the light emitting element 200 has a rotationally asymmetric planar shape, the distance at which the first electrode 210 and the second electrode 220 are spaced apart from the light emitting element 200 may be increased, so that the occurrence possibility of defects due to alignment errors may be reduced, and as the area occupied by the first electrode 210 and the second electrode 220 is reduced, an area emitting the light may be widened. In addition, since the plurality of wells 110, 120 and 130 of the substrate 100 includes a plurality of areas, the light emitting element 200 may be oriented in one of a plurality of directions, and thus transfer efficiency may be increased.

The first well 110, the second well 120, and the third well 130 of the light emitting element transferring method according to the example embodiment of FIGS. 19A and 19B each include one of areas that do not overlap with each other, and the light emitting element 200 may be oriented in a first direction D1 of the first well 110, a first direction D1' of the second well 120 or a first direction D" of the third well 130 and inserted in each of the area. The first direction D1 of the first well 110, the first direction D1' of the second well 120, and the first direction D" of the third well 130 may be different from each other. The first well 110, the second well 120, and the third well 130 according to the example embodiment of FIGS. 19A and 19B may be similar to those of example embodiment having the first well 110 and the second well 120 according to the example embodiment described with reference to FIG. 1 except that each of the first well 110, the second well 120, and the third well 130 according to the example embodiment of FIGS. 19A and 19B includes only one area.

The first well 110, the second well 120, and the third well 130 may be arranged in an arc shape based on an arbitrary central axis perpendicular to the substrate 100. The first electrode pad 310 and the second electrode pad 320 may be disposed in a straight line as shown in FIG. 19A or may be disposed in an arc shape as shown in FIG. 19B. When the electrode pads are arranged in an arc shape to match the arrangement of the wells 110, 120, and 130, it may be possible to reduce the probability that an error occurs in the connection between the first electrode 210 and the first electrode pad 310 and the connection between the second electrode 220 and the second electrode pad 320. The arc-shaped first electrode pad 310 and second electrode pad 320 may extend to have a ring shape. In this case, the first electrode pad 310 having a smaller radius may have various shapes, such as a ring shape, as well as a circular shape, an elliptical shape, and a polygonal shape. FIGS. 19A and 19B illustrate that the first well 110, the second well 120, and the third well 130 are provided, but is not limited thereto, and may be included in the subpixel SUB1 including only the first well 110 and the second well 120.

The display transfer structure 10 described with reference to FIGS. 1 to 19B may be applied to a display device.

Figure 20:
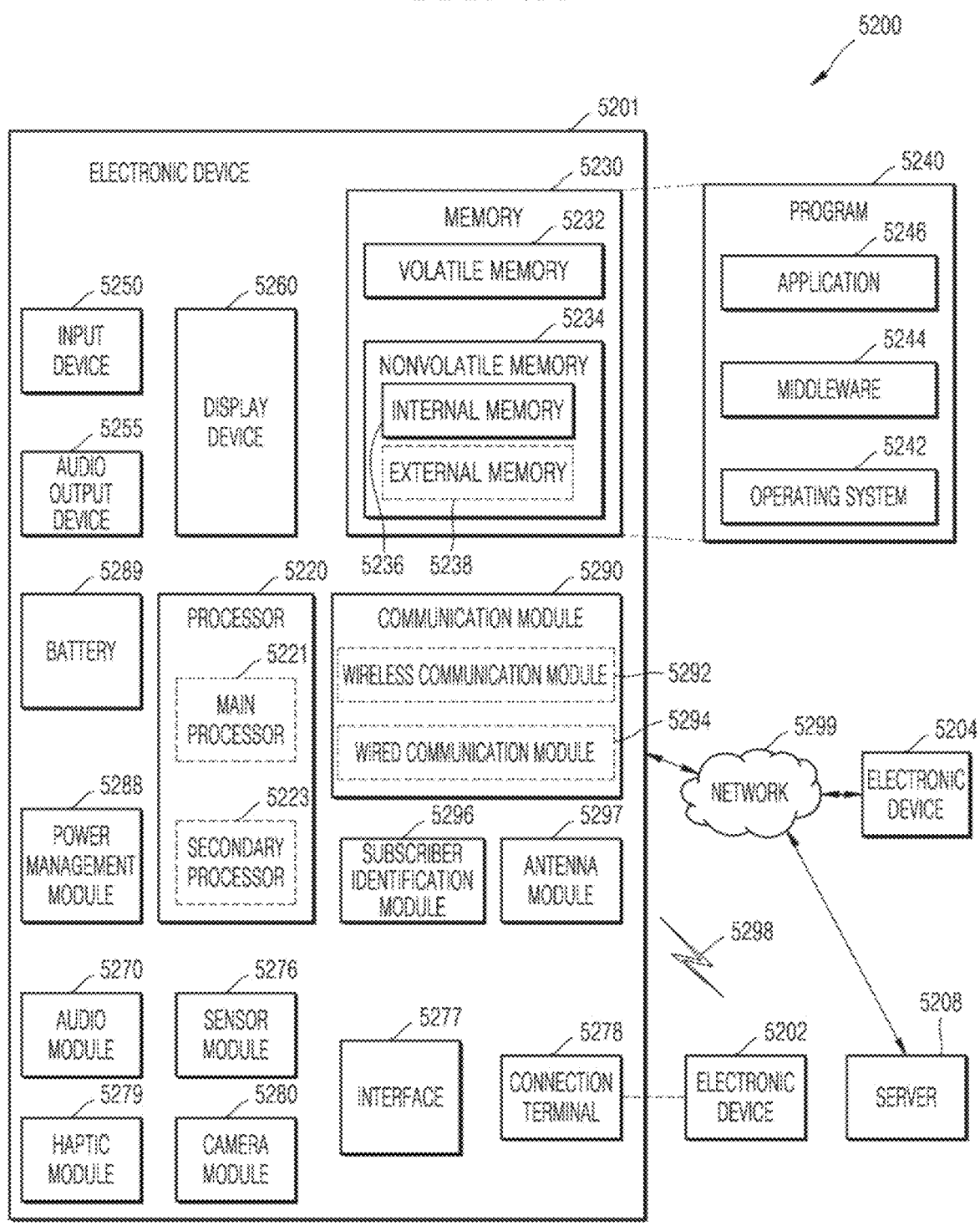
FIG. 20 is a block diagram of an electronic device including a display device according to an example embodiment.

FIG. 20 is a block diagram of an electronic device including a display device according to an example embodiment.

Referring to FIG. 20, an electronic device 5201 may be provided in a network environment 5200. In the network environment 5200, the electronic device 5201 may communicate with another electronic device 5202 through a first network 5298 (such as a short-range wireless communication network, etc.), or communicate with another electronic device 5204 and/or a server 5208 through a second network 5299 (such as a remote wireless communication network). The electronic device 5201 may communicate with the electronic device 5204 through the server 5208. The electronic device 5201 may include a processor 5220, a memory 5230, an input device 5250, an audio output device 5255, a display device 5260, an audio module 5270, a sensor module 5276, and an interface 5277, a haptic module 5279, a camera module 5280, a power management module 5288, a battery 5289, a communication module 5290, a subscriber identification module 5296, and/or an antenna module 5297. In the electronic device 5201, some of these components may be omitted or other components may be added. Some of these components may be implemented as one integrated circuit. For example, the sensor module 5276 (fingerprint sensor, iris sensor, illuminance sensor, etc.) may be implemented by being embedded in the display device 5260 (display, etc.).

The processor 5220 may execute software (the program 5240, etc.) to control one or a plurality of other components (such as hardware, software components, etc.) of the electronic device 5201 connected to the processor 5201, and perform various data processing or operations. As part of data processing or operation, the processor 5220 may load commands and/or data received from other components (such as the sensor module 5276, the communication module 5290, etc.) into the volatile memory 5232, process commands and/or data stored in the volatile memory 5232, and store result data in the nonvolatile memory 5234. The processor 5220 may include a main processor 5221 (such as a central processing unit, an application processor, etc.) and a secondary processor 5223 (such as a graphics processing unit, an image signal processor, a sensor hub processor, a communication processor, etc.) that may be operated independently or together. The secondary processor 5223 may use less power than the main processor 5221 and may perform specialized functions.

The secondary processor 5223 may control functions and/or states related to some of the components of the electronic device 5201 (such as the display device 5260, the sensor module 5276, the communication module 5290, etc.) instead of the main processor 5221 while the main processor 5221 is in an inactive state (sleep state), or with the main processor 5221 while the main processor 5221 is in an active state (application execution state). The secondary processor 5223 (such as an image signal processor, a communication processor, etc.) may be implemented as part of other functionally related components (such as the camera module 5280, the communication module 5290, etc.).

The memory 5230 may store various data required by components of the electronic device 5201 (such as the processor 5220, the sensor module 5276, etc.). The data may include, for example, software (such as the program 5240, etc.) and input data and/or output data for commands related thereto. The memory 5230 may include a volatile memory 5232 and/or a nonvolatile memory 5234.

The program 5240 may be stored as software in the memory 5230 and may include an operating system 5242, a middleware 5244, and/or an application 5246.

The input device 5250 may receive commands and/or data to be used for components (such as the processor 5220, etc.) of the electronic device 5201 from outside (a user) of the electronic device 5201. The input device 5250 may include a remote controller, a microphone, a mouse, a keyboard, and/or a digital pen (such as a stylus pen).

The audio output device 5255 may output an audio signal to the outside of the electronic device 5201. The audio output device 5255 may include a speaker and/or a receiver. The speaker may be used for general purposes such as multimedia playback or recording playback, and the receiver may be used to receive incoming calls. The receiver may be combined as a part of the speaker or may be implemented as an independent separate device.

The display device 5260 may visually provide information to the outside of the electronic device 5201. The display device 5260 may include a display, a hologram device, or a projector and a control circuit for controlling the device. The display device 5260 may include the display transfer structure 10 described with reference to FIGS. 1 to 19B. The display device 5260 may include a touch circuit set to sense a touch, and/or a sensor circuit (such as a pressure sensor) set to measure the strength of a force generated by the touch.

The audio module 5270 may convert sound into an electrical signal, or conversely, may convert an electrical signal into sound. The audio module 5270 may acquire sound through the input device 5250 or output sound through speakers and/or headphones of the audio output device 5255, and/or another electronic device (such as the electronic device 8102) directly or wirelessly connected to electronic device 5201.

The sensor module 5276 may detect an operating state (such as power, temperature, etc.) of the electronic device 5201 or an external environmental state (such as a user state, etc.), and generate an electrical signal and/or data value corresponding to the detected state. The sensor module 5276 may include a gesture sensor, a gyro sensor, a barometric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface 5277 may support one or more specified protocols that may be used for the electronic device 5201 to connect directly or wirelessly with another electronic device (such as the electronic device 8102). The interface 5277 may include a High Definition Multimedia Interface (HDMI), a Universal Serial Bus (USB) interface, an SD card interface, and/or an audio interface.

The connection terminal 5278 may include a connector through which the electronic device 5201 may be physically connected to another electronic device (such as the electronic device 5202). The connection terminal 5278 may include an HDMI connector, a USB connector, an SD card connector, and/or an audio connector (such as a headphone connector).

The haptic module 5279 may convert an electrical signal into a mechanical stimulus (such as vibration, movement, etc.) or an electrical stimulus that a user may perceive through a tactile or motor sense. The haptic module 5279 may include a motor, a piezoelectric element, and/or an electrical stimulation device.

The camera module 5280 may capture a still image and a video. The camera module 5280 may include a lens assembly including one or more lenses, image sensors, image signal processors, and/or flashes. The lens assembly included in the camera module 5280 may collect light emitted from a subject that is a target of image capturing.

The power management module 5288 may manage power supplied to the electronic device 5201. The power management module 8388 may be implemented as a part of a power management integrated circuit (PMIC).

The battery 5289 may supply power to components of the electronic device 5201. The battery 5289 may include a non-rechargeable primary cell, a rechargeable secondary cell, and/or a fuel cell.

The communication module 5290 may support establishing a direct (wired) communication channel and/or a wireless communication channel, and performing communication through the established communication channel between the electronic device 5201 and other electronic devices (such as the electronic device 8102, the electronic device 8104, the server 8108, etc.). The communication module 5290 may include one or more communication processors that operate independently of the processor 5220 (such as an application processor) and support direct communication and/or wireless communication. The communication module 5290 may include a wireless communication module 5292 (such as a cellular communication module, a short-range wireless communication module, a Global Navigation Satellite System (GNSS) communication module, etc.) and/or a wired communication module 5294 (such as a local area network (LAN) communication module, a power line communication module, etc.). Among these communication modules, a corresponding communication module may communicate with other electronic devices through a first network 5298 (a short-range communication network such as Bluetooth, WiFi Direct, or Infrared Data Association (IrDA)) or a second network 5299 (a cellular network, the Internet, or a telecommunication network such as a computer network (such as LAN, WAN, etc.). These various types of communication modules may be integrated into one component (such as a single chip, etc.), or may be implemented as a plurality of separate components (a plurality of chips). The wireless communication module 5292 may check and authenticate the electronic device 2201 in a communication network such as the first network 5296 and/or the second network 5298 using the subscriber information (such as international mobile subscriber identifier (IMSI), etc.) stored in the subscriber identification module 5299.

The antenna module 5297 may transmit signals and/or power to the outside (such as other electronic devices) or receive signals and/or power from the outside. The antenna may include a radiator made of a conductive pattern formed on a substrate (such as PCB, etc.). The antenna module 5297 may include one or a plurality of antennas. When multiple antennas are included, an antenna suitable for a communication method used in a communication network such as the first network 5298 and/or the second network 5299 may be selected from the plurality of antennas by the communication module 5290. Signals and/or power may be transmitted or received between the communication module 5290 and another electronic device through the selected antenna. In addition to the antenna, other components (such as RFIC) may be included as part of the antenna module 5297.

Some of the components are connected to each other and may exchange signals (such as commands, data, etc.) through communication method between peripheral devices (such as bus, General Purpose Input and Output (GPIO), Serial Peripheral Interface (SPI), Mobile Industry Processor Interface (MIPI), etc.).

The command or data may be transmitted or received between the electronic device 5201 and the external electronic device 5204 through the server 8108 connected to the second network 5299. The other electronic devices 5202 and 5204 may be the same or different types of devices as or from the electronic device 5201. All or some of the operations executed by the electronic device 5201 may be executed by one or more of the other electronic devices 5202, 5204, and 5208. For example, when the electronic device 5201 needs to perform a certain function or service, instead of executing the function or service itself, the electronic device 2201 may request one or more other electronic devices to perform the function or part or all of the service. One or more other electronic devices that receive the request may execute an additional function or service related to the request, and transmit a result of the execution to the electronic device 5201. For this, cloud computing, distributed computing, and/or client-server computing technology may be used.

Figure 21:
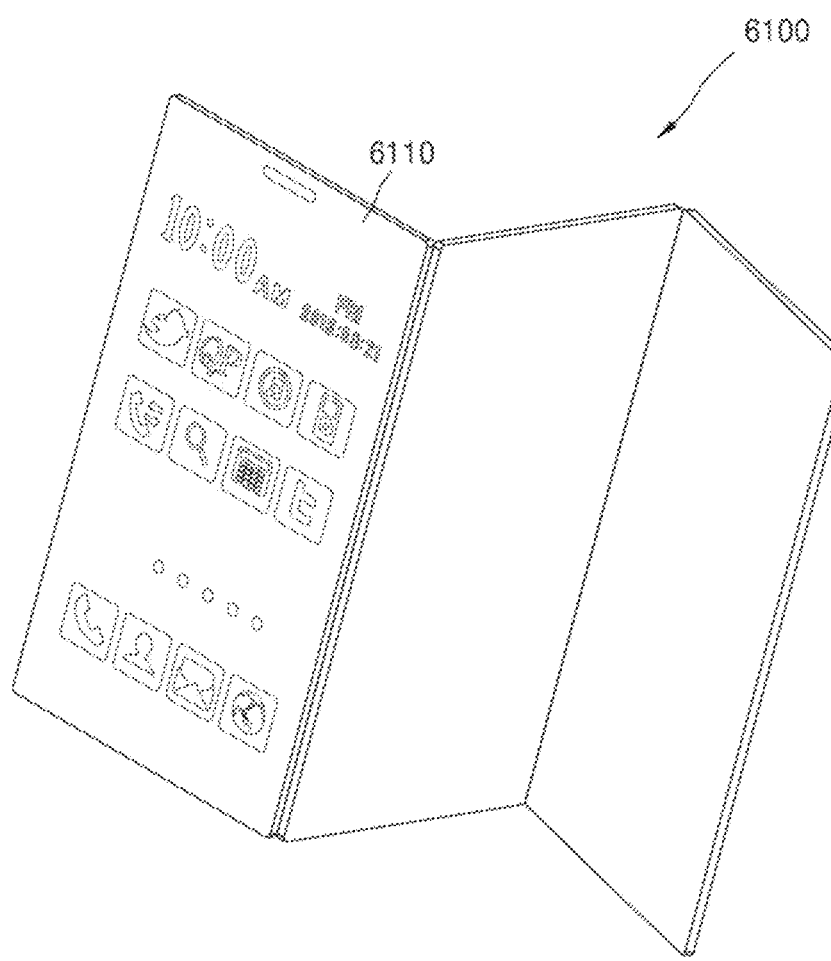
FIG. 21 shows an example in which a display device according to an example embodiment is applied to a mobile device.

FIG. 21 shows an example in which a display device according to an example embodiment is applied to a mobile device. A mobile device 6100 may include a display device 6110 according to an example embodiment. The display device 6110 may include the display transfer structure 10 described with reference to FIGS. 1 to 19B. The display device 6110 may have a foldable structure, and may be applied to, for example, a multi-folder display. Here, although the mobile device 6100 is illustrated as a folder-type display, it may be applicable to a general flat panel display.

Figure 22:
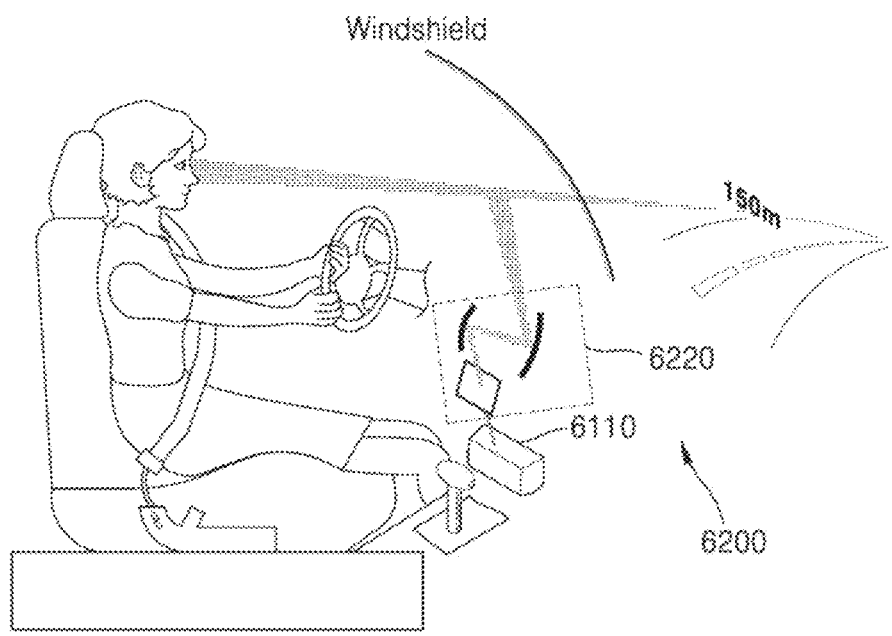
FIG. 22 shows an example in which a display device according to an example embodiment is applied to a vehicle.

FIG. 22 shows an example in which a display device according to an example embodiment is applied to a vehicle. The display device may be applied to a head-up display device for a vehicle. The heads-up display device 6200 may include a display device 6210 provided in an area of the vehicle, and at least one light path changing member 6220 that converts the path of light so that the driver may see the image generated by the display device 6210.

Figure 23:
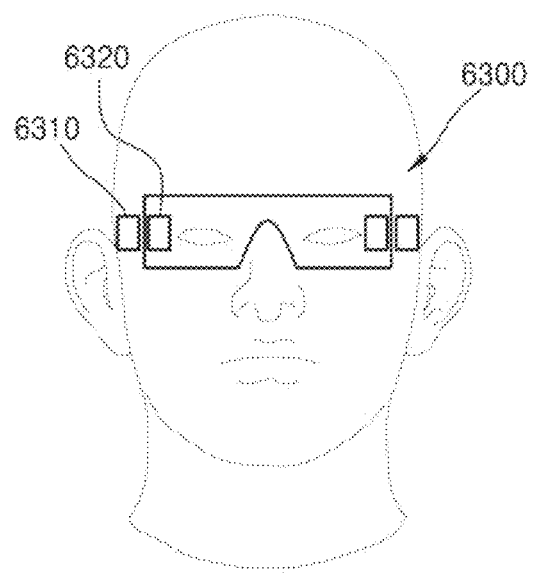
FIG. 23 illustrates an example in which a display device according to an example embodiment is applied to augmented reality glasses or virtual reality glasses.

FIG. 23 illustrates an example in which a display device according to an example embodiment is applied to augmented reality glasses or virtual reality glasses. An augmented reality glasses 6300 may include a projection system 6310 that forms an image, and at least one element 6320 that guides the image from the projection system 6310 into the user's eye. The projection system 6310 may include the display transfer structure 10 described with reference to FIGS. 1 to 19B.

Figure 24:
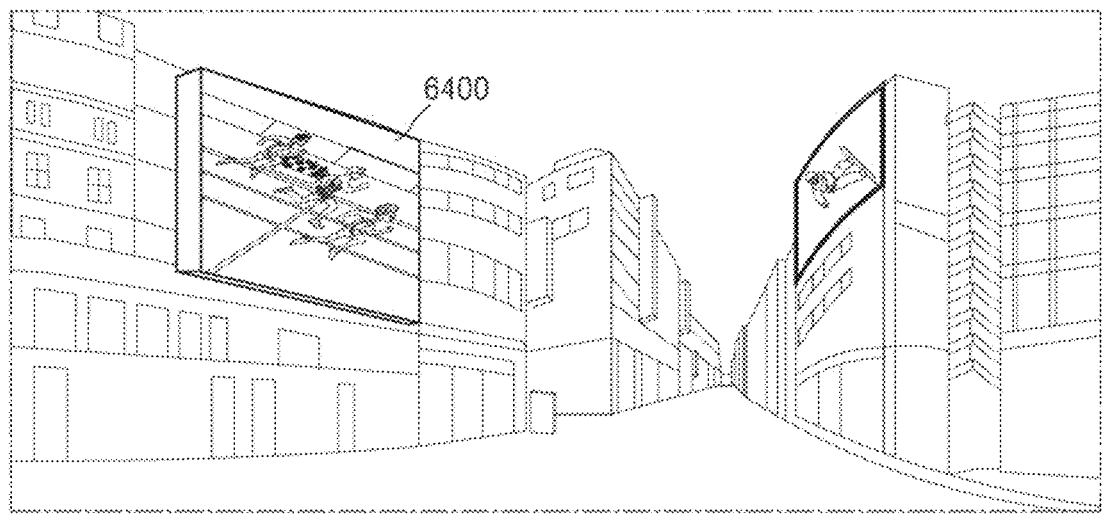
FIG. 24 shows an example in which a display device according to an example embodiment is applied to a large-sized signage.

FIG. 24 shows an example in which a display device according to an example embodiment is applied to a large-sized signage. A signage 6400 may be used for outdoor advertisement using a digital information display, and may control advertisement contents and the like through a communication network. The signage 6400 may be implemented, for example, through the electronic device described with reference to FIG. 20.

Figure 25:
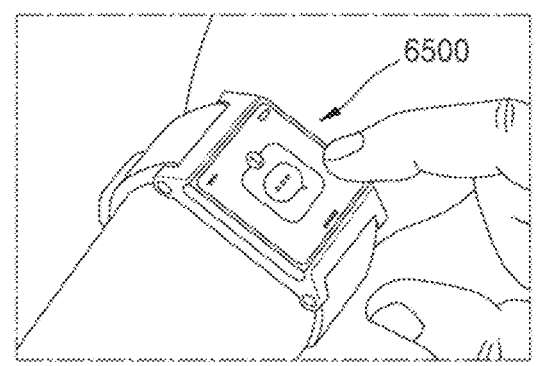
FIG. 25 illustrates an example in which a display device according to an example embodiment is applied to a wearable display.

FIG. 25 illustrates an example in which a display device according to an example embodiment is applied to a wearable display. The wearable display 6500 may include the display transfer structure 10 described with reference to FIGS. 1 to 19B, and may be implemented through the electronic device described with reference to FIG. 20.

The display device according to the example embodiment may also be applied to various products such as a rollable television (TV) and a stretchable display.

In the display transfer structure according to the example embodiment, the interval between the electrodes is secured, thereby reducing the occurrence of defects due to alignment errors and widening the light emitting area, and at the same time, the light emitting elements may be arranged in various directions.

The light emitting element of the display transfer structure according to the example embodiment has a rotationally asymmetric shape to secure an interval (electrode interval) between the first electrode and the second electrode disposed on the light emitting element so that the occurrence of defects due to alignment error may be reduced and the light emitting area may be widened.

A substrate well of a display transfer structure according to an example embodiment includes a first area and a second area, so that since the light emitting element may be disposed in the first area in the first direction or in the second area in the second direction, transfer efficiency (yield) may be increased.

The substrate of the display transfer structure according to the example embodiment may include a plurality of wells in one subpixel to increase transfer efficiency (yield).

A substrate well of a display transfer structure according to an example embodiment includes a first area and a second area, so that since the light emitting element may be disposed in an area where the first area and the second area overlap, the transfer efficiency (yield) may be increased.

The light emitting element of the display transfer structure according to an example embodiment has a tapered planar shape, and the well of the substrate has a tapered planar shape having taper per inch TPI equal to or greater than the TPI of the light emitting element, so that since the light emitting element may be disposed in several directions instead of in one direction inside the well, it is possible to increase the transfer efficiency (yield).

When the substrate well of the display transfer structure according to the example embodiment has a circular shape, a light emitting element having a rotationally asymmetric planar shape may secure a larger electrode interval than a light emitting element having a rotationally asymmetric planar shape, thereby reducing the occurrence of defects due to an alignment error.

The light emitting element of the display transfer structure according to the example embodiment has rotational asymmetry and line asymmetry, so it is possible to reduce the occurrence of defects due to alignment errors, and when the shape of the well may be inserted even when the light emitting element is rotated, the reduction in transfer yield due to rotational asymmetry may be reduced. In addition, since there is no case of overturning and transferring due to a line asymmetric shape, it is possible to minimize electrical connection failure after transfer.

In the display transfer structure according to the example embodiment, the light emitting element is transferred to a large area, so that it may be more easily employed in a large display device.

The light emitting element transferring method according to an example embodiment may efficiently align the light emitting element on a large area. Therefore, the light emitting element transferring method may be applied to a large-sized display device, and the cost of large-area transfer may be lowered, thereby lowering the unit cost of the display device.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims and their equivalents.

What is claimed is:
1. A display transfer structure comprising:
a substrate comprising a plurality of wells; and
a plurality of light emitting elements disposed in the plurality of wells,
wherein the plurality of light emitting elements have a rotationally asymmetric planar shape, wherein the plurality of wells respectively have a planar shape different from a planar shape of each of the plurality of light emitting elements,
wherein a first well of the plurality of wells comprises a first area and a second area partially overlapping each other,
wherein a first light emitting element among the plurality of light emitting elements is disposed in the first area or the second area,
wherein the first area and the second area respectively have a planar shape corresponding to a planar shape of the first light emitting element,
wherein the first area and the second area are connected each other and a size and a shape of the first area is same as a shape and a size of the second area,
wherein the first well and a second well among the plurality of wells that are adjacent to each other are included in a subpixel,
wherein the first well and the second well are disposed in an arc shape with respect to a predetermined central axis perpendicular to the substrate, and
wherein a first electrode pad and a second electrode pad of the substrate have an arc shape or ring shape with respect to the predetermined central axis.

2. The display transfer structure of claim 1, wherein the first area of the first well is oriented in a first direction,
wherein the second area of the first well is oriented in a second direction, and
wherein the first light emitting element is oriented in the first direction or the second direction based on the first area or the second area in which the first light emitting element is disposed.

3. The display transfer structure of claim 1, wherein the first well further comprises a third area partially overlapping with the second area,
wherein the first light emitting element is disposed in the first area, and
wherein a second light emitting element among the plurality of light emitting elements is disposed in the third area.

4. The display transfer structure of claim 1, wherein at least one of the plurality of light emitting elements comprises a first electrode and a second electrode spaced apart from each other,
wherein a plurality of first electrode pads and a plurality of second electrode pads are disposed on the substrate and spaced apart from each other,
wherein one of the plurality of first electrode pads is electrically connected to the first electrode, and
wherein one of the plurality of second electrode pads is electrically connected to the second electrode.

5. The display transfer structure of claim 1, wherein the first well and the second well are rotationally symmetric with respect to the predetermined central axis perpendicular to the substrate, and
wherein the first electrode pad and the second electrode pad disposed in the first well are rotationally symmetrical to a first pad and the second electrode pad disposed in the second well with respect to the predetermined central axis.

6. The display transfer structure of claim 1,
wherein the second area is an area in which the first area is rotated by a first angle in a counter-clockwise direction with respect to a specific rotation point, and
wherein the first light emitting element among the plurality of light emitting elements is disposed on an area where the first area and the second area overlap.

7. The display transfer structure of claim 6, wherein the first area is oriented in a first direction,
wherein the second area is oriented in a second direction in which the first direction is rotated by the first angle,
wherein the first light emitting element is oriented and disposed in a direction rotated by a second angle from the first direction, and
wherein the second angle is an angle between 0 degrees and the first angle.

8. The display transfer structure of claim 1, wherein the second area is an area in which the first area is moved in parallel by a first distance in a specific direction,
wherein the first light emitting element among the plurality of light emitting elements is disposed on an area where the first area and the second area overlap,
wherein the first area and the second area are oriented in a first direction, and
wherein the first light emitting element is oriented and disposed in the first direction.

9. The display transfer structure of claim 1, wherein the first light emitting element has a tapered planar shape,
wherein the first well has a tapered planar shape with taper per inch equal to or greater than taper per inch of the planar shape of the first light emitting element, and
wherein a smaller surface and a larger surface among surfaces intersecting a taper centerline of the first light emitting element are respectively disposed to face a smaller surface and a larger surface among surfaces intersecting a taper centerline of the first well.

10. The display transfer structure of claim 1, wherein a plane of at least one light emitting element among the plurality of light emitting elements has a trapezoidal shape, a center cut sector shape, or a polygonal shape.

11. The display transfer structure of claim 1, wherein a planar shape of at least one light emitting element among the plurality of light emitting elements is a trapezoidal shape or a sector shape that is cut at a center, and
wherein a first electrode and a second electrode are disposed on different areas of the at least one light emitting element based on a taper centerline of the at least one light emitting element.

12. The display transfer structure of claim 1, wherein a planar shape of at least one light emitting element among the plurality of light emitting elements has a line asymmetric shape.

13. The display transfer structure of claim 1, wherein the plurality of wells comprise a third well and a fourth well having different shapes,
wherein each of the plurality of light emitting elements comprise:
a third light emitting element disposed in the third well; and
a fourth light emitting element having a shape different from a shape of the third light emitting element and disposed in the fourth well.

14. A display transfer structure comprising:
a substrate comprising a plurality of wells; and
a plurality of light emitting elements disposed in the plurality of wells,
wherein the plurality of light emitting elements have a rotationally asymmetric planar shape,
wherein a first well and a second well among the plurality of wells that are adjacent to each other are included in a subpixel,
wherein the first well is oriented in a first direction and the second well is oriented in a second direction different from the first direction, wherein one of the plurality of light emitting elements disposed in the first well is oriented in the first direction, wherein the other one of the plurality of light emitting elements disposed in the second well is oriented in the second direction, wherein the first well of the plurality of wells comprises a first area and a second area partially overlapping each other, wherein a first light emitting element among the plurality of light emitting elements is disposed in the first area or the second area, wherein the first area and the second area respectively have a planar shape corresponding to a planar shape of the first light emitting element, wherein the first area and the second area are connected each other and a size and a shape of the first area is same as a shape and a size of the second area, wherein the first well and the second well are disposed in an arc shape with respect to a predetermined central axis perpendicular to the substrate, and wherein a first electrode pad and a second electrode pad of the substrate have an arc shape or ring shape with respect to the predetermined central axis.

15. A light emitting element transferring method comprising:

preparing a substrate comprising a plurality of wells; and transferring a plurality of light emitting elements having a rotationally asymmetric planar shape to the plurality of wells, wherein the plurality of wells respectively have a planar shape different from a shape of each of the plurality of light emitting elements, wherein a first well of the plurality of wells comprises a first area and a second area partially overlapping each other, wherein the transferring of the plurality of light emitting elements comprises inserting a first light emitting element among the plurality of light emitting elements into the first area in a first direction or into the second area in a second direction, wherein the first area and the second area respectively have a planar shape corresponding to a planar shape of the first light emitting element, wherein the first area and the second area are connected each other and a size and a shape of the first area is same as a shape and a size of the second area, wherein the first well and a second well among the plurality of wells that are adjacent to each other are included in a subpixel, wherein the first well and the second well are disposed in an arc shape with respect to a predetermined central axis perpendicular to the substrate, and wherein a first electrode pad and a second electrode pad of the substrate have an arc shape or ring shape with respect to the predetermined central axis.

16. A display transfer structure comprising:

a substrate comprising a plurality of wells; and a plurality of light emitting elements disposed in the plurality of wells, wherein the plurality of light emitting elements have a rotationally asymmetric planar shape, wherein at least two of the plurality of wells are disposed at different orientations from each other, wherein a first well of the plurality of wells comprises a first area and a second area partially overlapping each other, wherein a first light emitting element among the plurality of light emitting elements is disposed in the first area or the second area, wherein the first area and the second area respectively have a planar shape corresponding to a planar shape of the first light emitting element, wherein the first area and the second area are connected each other and a size and a shape of the first area is same as a shape and a size of the second area, wherein the first well and a second well among the plurality of wells that are adjacent to each other are included in a subpixel, wherein the first well and the second well are disposed in an arc shape with respect to a predetermined central axis perpendicular to the substrate, and wherein a first electrode pad and a second electrode pad of the substrate have an arc shape or ring shape with respect to the predetermined central axis.

* * * * *